United States Patent
Li

(10) Patent No.: US 11,126,402 B2
(45) Date of Patent: Sep. 21, 2021

(54) TERNARY COMPUTATION MEMORY SYSTEMS AND CIRCUITS EMPLOYING BINARY BIT CELL-XNOR CIRCUITS PARTICULARLY SUITED TO DEEP NEURAL NETWORK (DNN) COMPUTING

(71) Applicant: QUALCOMM Incorporated, San Diego, CA (US)

(72) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 162 days.

(21) Appl. No.: 16/360,698

(22) Filed: Mar. 21, 2019

(65) Prior Publication Data

US 2020/0301668 A1   Sep. 24, 2020

(51) Int. Cl.
G06F 7/544       (2006.01)
G11C 11/412      (2006.01)
G11C 11/419      (2006.01)

(52) U.S. Cl.
CPC .......... G06F 7/5443 (2013.01); G11C 11/412 (2013.01); G11C 11/419 (2013.01)

(58) Field of Classification Search
CPC ........ G06F 7/5443; G06F 7/523; G06F 17/16; G11C 11/412–419; G11C 11/409–4097;
(Continued)

(56) References Cited

U.S. PATENT DOCUMENTS 7,839,713 B1 * 11/2010 Yu ................. G11C 11/412
                                         365/230.05
10,461,751 B2 * 10/2019 Obradovic ......... G11C 11/223
(Continued)

OTHER PUBLICATIONS

Bankman, D. et al., "An always-on 3.8 uJ/86% CIFAR-10 mixed-signal binary CNN processor with all memory on chip in 28nm CMOS," 2018 IEEE International Solid-State Circuits Conference, Feb. 13, 2018, IEEE, pp. 222-223.
Dong, Q. et al., "A 0.3V VDDmin 4+2T SRAM for Searching and In-Memory Computing Using 55nm DDC Technology," 2017 Symposium on VLSI Circuits Digest of Technical Papers, JSAP, pp. C160-C161.
(Continued)

*Primary Examiner* — Aimee Li
*Assistant Examiner* — Carlo Waje
(74) *Attorney, Agent, or Firm* — QUALCOMM Incorporated

(57) ABSTRACT

A multiply-accumulate (MAC) operation in a deep neural network (DNN) consists of multiplying each input signal to a node by a respective numerical weight data and summing the products. Using ternary values for the input signals and weight data reduces memory and processing resources significantly. By representing ternary values in two-bit binary form, MAC operations can be replaced with logic operations (e.g., XNOR, popcount) implemented in logic circuits integrated into individual memory array elements in which the numerical weight data are stored. In this regard, a ternary computation circuit (TCC) includes a memory circuit integrated with a logic circuit. A memory array including TCCs performs a plurality of parallel operations (e.g., column or row elements) and determines a popcount. A TCC array in which logic circuits in columns or rows employ a single read-enable signal can reduce routing complexity and congestion of a metal layer in a semiconductor device.

29 Claims, 15 Drawing Sheets

(58) Field of Classification Search
CPC ........ G11C 13/0021–0028; G11C 7/22; G11C 7/106; G06N 3/04; G06N 3/06; G06N 3/063
See application file for complete search history.

(56) References Cited

U.S. PATENT DOCUMENTS

| | | | |
|---|---|---|---|
| 10,740,434 B1 * | 8/2020 | Duong | G06F 7/5443 |
| 10,777,259 B1 * | 9/2020 | Wang | G11C 11/412 |
| 10,964,362 B2 * | 3/2021 | Jiang | G11C 7/1075 |
| 2018/0144240 A1 * | 5/2018 | Garbin | G06N 3/063 |
| 2018/0158520 A1 * | 6/2018 | Shu | G11C 7/18 |
| 2018/0315473 A1 * | 11/2018 | Yu | G11C 11/412 |
| 2019/0087719 A1 * | 3/2019 | Seo | G11C 11/412 |
| 2019/0102359 A1 * | 4/2019 | Knag | G06N 3/063 |
| 2019/0205095 A1 * | 7/2019 | Gupta | G06F 7/5443 |
| 2020/0066332 A1 * | 2/2020 | Fujiwara | H01L 27/1104 |
| 2020/0098428 A1 * | 3/2020 | Gaillardon | G06N 3/0454 |
| 2021/0089272 A1 * | 3/2021 | Jain | G06N 3/063 |
| 2021/0134343 A1 * | 5/2021 | Li | G11C 7/1006 |

OTHER PUBLICATIONS

Jiang, Z. et al., "XNOR-SRAM: In-Memory Computing SRAM Macro for Binary/Ternary Deep Neural Networks," 2018 Symposium on VLSI Technology Digest of Technical Papers, IEEE, pp. 173-174.

Kang, M. et al., "A 19.4 nJ/Decision 364K Decisions/s In-Memory Random Forest Classifer in 6T SRAM Array," 2017 IEEE European Solid State Circuits Conference (ESSCIRC), IEEE, 14 pages.

Li, M., "Balanced Ternary Vector-Matrix Multiplication on a Ternary Optical Computer," International Journal of Sumilation—Systems, Science & Technology, vol. 17, Issue 46, 2016, United Kingdom Simulation Society, 4 pages.

Wang, Y. et al., "Neural Network Accelerator Interference," 2019, NICS Lab of Tsinghua University, https://nicsefc.ee.tsinghua.edu.cn/projects/neural-network-accelerator/, 2 pages.

Zhang, J., "In-Memory Computation of a Machine-Learning Classifier in a Standard 6T SRAM Array," IEEE Journal of Solid-State Circuits, 2017, IEEE, 10 pages.

* cited by examiner

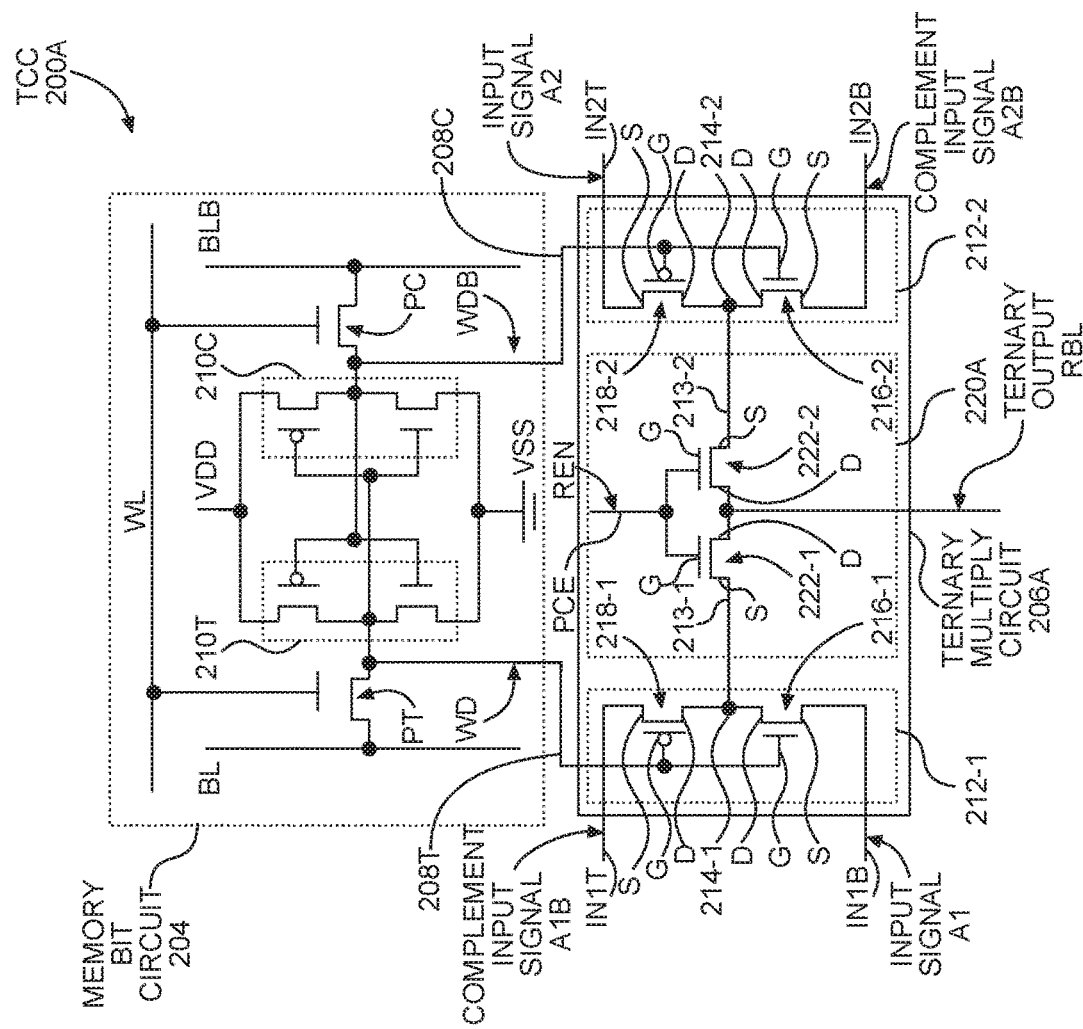

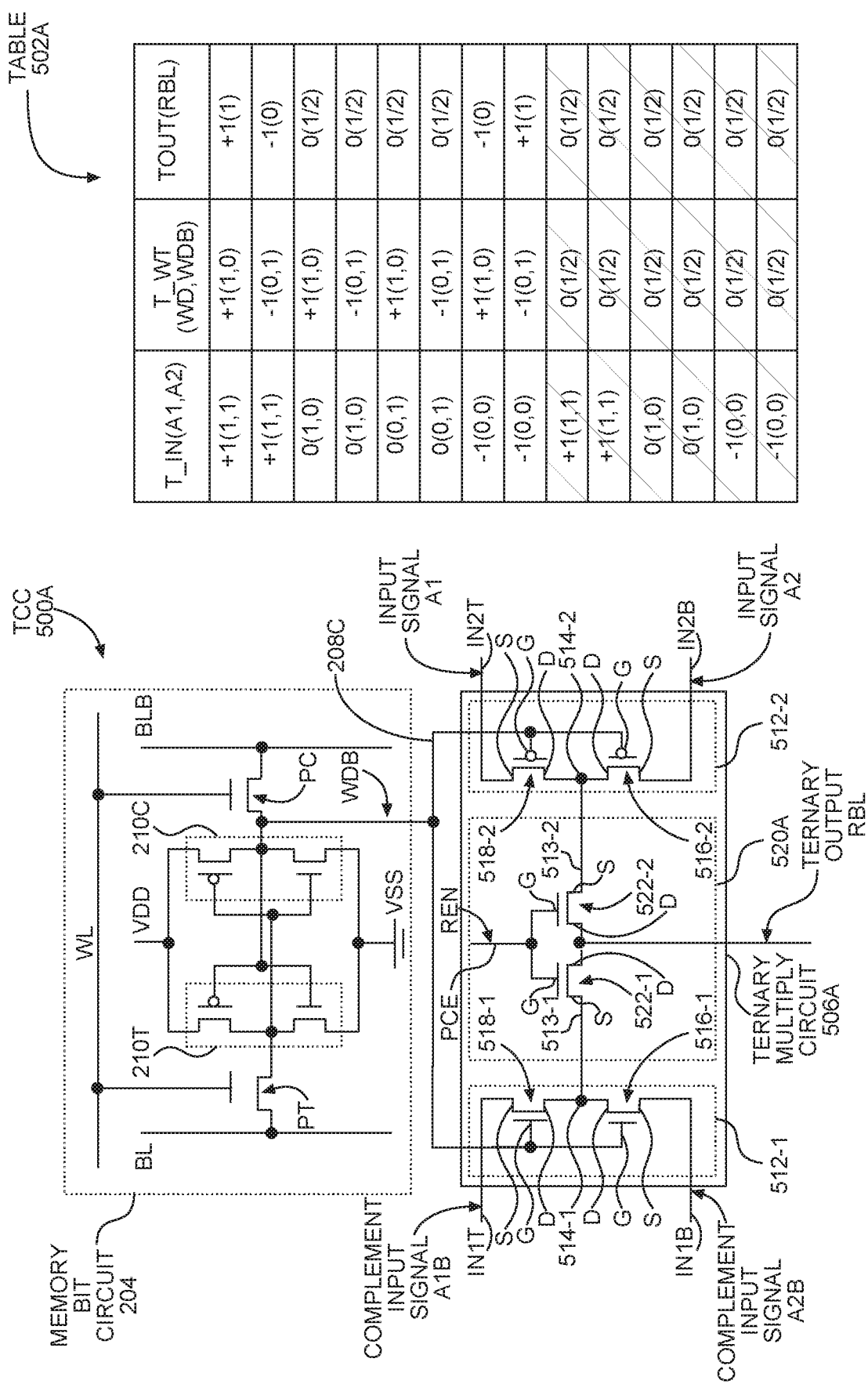

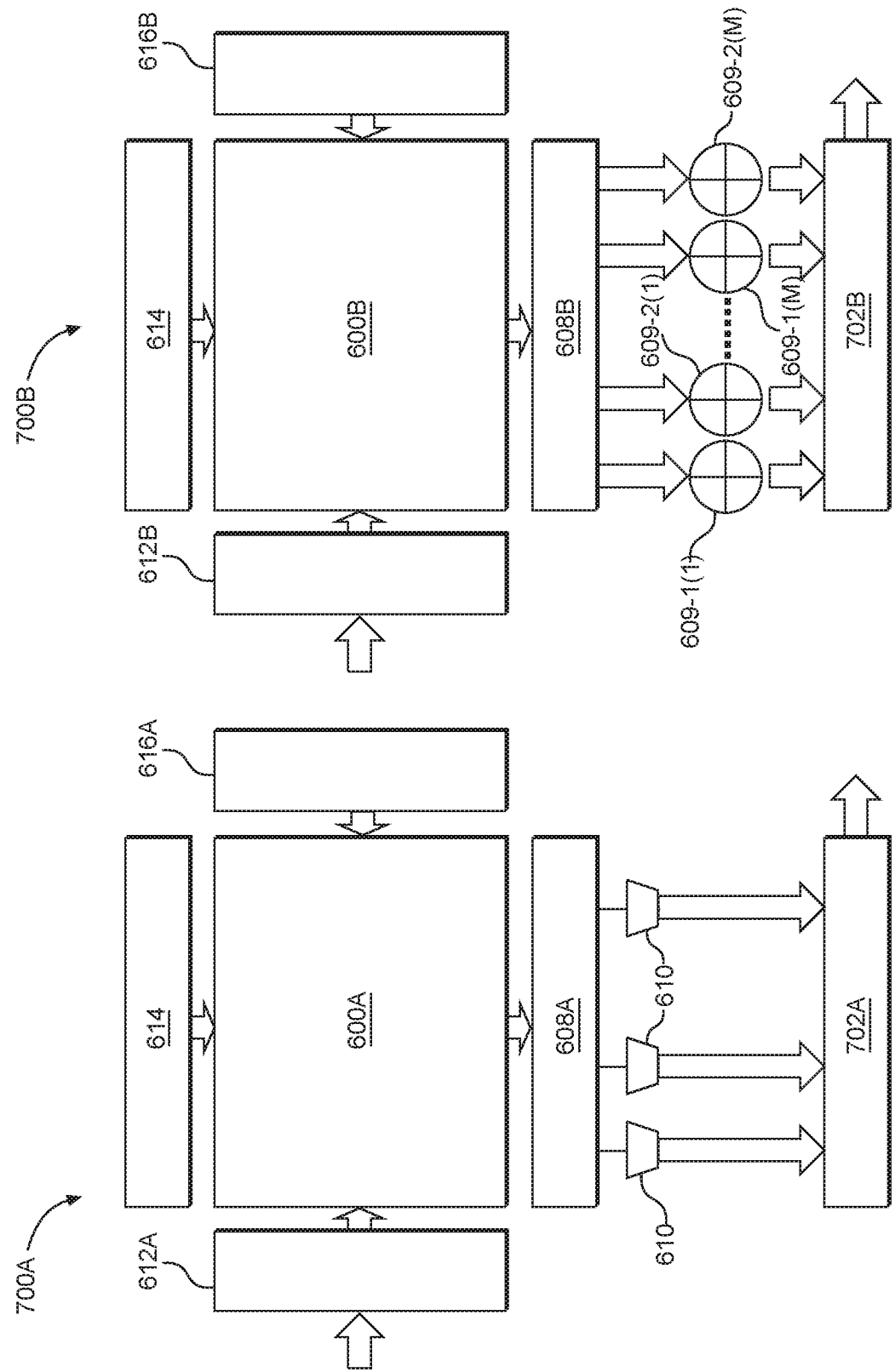

TERNARY COMPUTATION MEMORY SYSTEMS AND CIRCUITS EMPLOYING BINARY BIT CELL-XNOR CIRCUITS PARTICULARLY SUITED TO DEEP NEURAL NETWORK (DNN) COMPUTING

BACKGROUND

I. Field of the Disclosure

The technology of the disclosure relates generally to deep neural network computing and, more particularly, to ternary computation circuits integrated with static random access memory (SRAM) cell circuits for deep neural network computing.

II. Background

Machine learning is the ability of a computing device to progressively improve performance of a particular task. For example, machine-learning algorithms can use results from processing known data to "train" a computing device to process new data with a higher degree of accuracy. Neural networks are a framework in which machine-learning algorithms may be implemented. A neural network is modeled after the organization of a brain, with a plurality of nodes that each correspond to a brain synapse. Each node receives input signals from preceding nodes and generates an output that becomes an input signal to succeeding nodes. The nodes are organized in sequential layers such that, in a first processing stage, nodes of a first layer receive input data from an external source and generate an output that is provided to every node in a second layer. In a next processing stage, nodes of the second layer receive the outputs of each node in the first layer, and generate further outputs to be provided to every node in a third layer as the nodes in the first layer receive and process new external inputs, and so on in subsequent processing stages.

Within each node, each input signal is uniquely weighted by multiplying the numerical input signal by an associated numerical weight. The products corresponding to the weighted input signals are summed to generate a node output. Together, these operations are known as a multiply-accumulate (MAC) operation. FIG. 1 is a block diagram representing the operation of a conventional node 100 that may be used in a neural network. In the node 100, each of the numerical input signals $X_0$-$X_M$ are received and multiplied by respective numerical weight data $W_0$-$W_M$ to generate products $P_0$-$P_M$. The numerical weight data $W_0$-$W_M$ are stored and reused by the node 100 in each processing stage. The numerical weight data $W_0$-$W_M$ may be updated in a machine-learning method using feedback based on a comparison of actual results to expected results when processing known data. The node 100 uses an accumulation or summation function to add the products $P_0$-$P_M$ together to create the SUM signal. The conventional node 100 may include an additional step in which an "activation function" may be performed on the SUM signal to produce an OUTPUT signal from the node 100. However, the activation function is beyond the scope of this disclosure and is not discussed further herein.

The node 100 in FIG. 1 performs "M" multiply operations and a summation function at each processing stage as a new set of numerical input signals $X_0$-$X_M$ are provided. The number of operations performed by a processing device executing a neural network framework will depend on the number of external inputs to the neural network, the number of nodes in each layer, and the number of layers in the neural network. In large neural networks, the processing device must execute thousands of operations at each processing stage. When the numerical input signals and weights are high-precision floating-point values, a significant amount of processing time, power, and memory are required to perform the MAC operations, consuming a large amount of energy, much of which is dissipated as heat. In addition, large amounts of data must be transferred between memory and one or more processors performing the MAC operations, which can cause delays that increase the response time of an application. Thus, neural network applications executing on conventional processing devices may have very slow response times, occupy large amounts of memory and cause battery-operated devices to discharge quickly.

To save memory and energy, and reduce processing complexity associated with high-precision floating point values, quantization of the numerical input signals and weights limits the set of possible values. By limiting the input signals and weights to a discrete set of possible values, memory consumption and processing complexity are reduced. In an example of balanced quantization, the input signals and weights may be limited to an equal number of values above and below zero. Binary quantization is an extreme case of quantization in which the values are limited to −1 and +1. It has been determined that implementing a neural network in which the inputs and weights are limited to a balanced ternary quantization, which includes the values of −1, 0, and +1, provides significant savings in memory, processing complexity, and energy with an acceptable loss in accuracy of the neural network results compared to implementing the input signals and weights as high-precision floating-point values.

SUMMARY OF THE DISCLOSURE

Ternary computation memory systems and circuits employing binary bit cell-XNOR circuits particularly suited to deep neural network (DNN) computing are disclosed. DNNs are frameworks of computing nodes in sequential layers with each node performing a multiply-accumulate (MAC) operation to generate an output. A MAC operation consists of multiplying each node input, which is typically in the form of a high-precision floating-point value, by a respective numerical weight data, and summing the products. It has been determined that, for some applications, the accuracy of results of a DNN does not significantly decrease when ternary values are used in place of floating-point values in MAC operations, but utilization of memory, energy, and processing resources significantly decreases. In addition, by representing ternary values in two-bit binary form, a node's MAC operations can be replaced with logic operations (e.g., XNOR, popcount) implemented in logic circuits. Such logic circuits are sufficiently small that they may be integrated into individual memory array elements in which the numerical weight data are stored.

In this regard, a ternary computation circuit (TCC) is disclosed that includes a memory circuit (e.g., bit cell) integrated with a logic circuit. The TCCs can be incorporated as memory elements like bit cells in a memory array. The logic circuits in each TCC use a logic operation (e.g., XNOR logic operation) to multiply a ternary input value by the numerical weight data stored in the memory circuit. A TCC employing a single read-enable signal is made possible by a balanced logic circuit to perform the XNOR logic operation. A memory array including TCCs performs a plurality of parallel operations (e.g., column or row elements) and determines a popcount (e.g., number of bits set to "1"), which corresponds to an accumulate operation. A semiconductor device implementing a TCC array can reduce response times of neural network applications compared to conventional processing devices. In addition, a TCC array in which logic circuits in columns or rows employ a single read-enable signal can reduce routing complexity and congestion of a metal layer in a semiconductor device.

In this regard, in one aspect, a TCC is disclosed. The TCC includes a read-enable input configured to receive a read-enable signal, a plurality of inputs configured to receive a plurality of input signals indicating a ternary input value, and a ternary output. The TCC also includes a memory bit cell circuit configured to store a weight data and a complement weight data complementary to the weight data. The TCC also includes a ternary multiply circuit configured to multiply the ternary input value and the weight data in response to the read-enable signal indicating an active state. The ternary multiply circuit includes a first control circuit configured to couple at least one of a first input signal and a second input signal among the plurality of input signals to a first signal node to generate a first product input signal in response to the weight data, a second control circuit configured to couple a third input signal and a fourth input signal among the plurality of input signals to a second signal node to generate a second product signal in response to the weight data, and a product circuit coupled to the first and second signal nodes, the product circuit configured to generate a ternary product signal on the ternary output based on the first product signal and the second product signal in response to the read-enable signal indicating the active state.

In another aspect, a method of multiplying a ternary input with a stored weight data is disclosed. The method includes receiving a plurality of binary input signals indicating a ternary input value, receiving a stored weight data from a memory bit cell circuit configured to store the weight data and a complement weight data complementary to the weight data, and receiving a read-enable signal on a read-enable input. The method further includes coupling at least one of a first binary input signal and a second binary input signal of the plurality of binary input signals to a first signal node, in response to the stored weight data, to generate a first product input signal, coupling at least one of a third binary input signal and a fourth binary input signal of the plurality of binary input signals to a second signal node, in response to the stored weight data, to generate a second product input signal, and generating a ternary product signal on a ternary output in response to the read-enable signal indicating an active state, the ternary product signal indicated by the first product input signal and the second product input signal.

In another aspect, an in-memory computation array is disclosed. The in-memory computation array includes an N×M array of ternary computation circuit (TCC) elements. The TCC elements each include a read-enable input configured to receive a read-enable signal, a plurality of inputs configured to receive a plurality of input signals indicating a ternary input value, and a ternary output. The TCC elements also include a memory bit cell circuit configured to store a weight data and a complement weight data complementary to the weight data. The TCC elements also include a ternary multiply circuit configured to multiply the ternary input value and the weight data in response to the read-enable signal indicating an active state. The ternary multiply circuit includes a first control circuit configured to couple at least one of a first input signal and a second input signal among the plurality of input signals to a first signal node to generate a first product input signal in response to the weight data, a second control circuit configured to couple a third input signal and a fourth input signal among the plurality of input signals to a second signal node to generate a second product signal in response to the complement weight data, and a product circuit coupled to the first and second signal nodes, the product circuit configured to generate a ternary product signal on the ternary output based on the first product signal and the second product signal in response to the read-enable signal indicating the active state.

BRIEF DESCRIPTION OF THE FIGURES

FIG. 2A-1 is a schematic view of a first ternary computation circuit (TCC) including a memory bit cell circuit (memory bit circuit) configured to store weight data and a ternary multiply circuit configured to multiply the stored weight data and a ternary input value received as a plurality of binary input signals and generate a ternary product as an analog signal in response to a single read-enable signal;

FIG. 2A-2 is a truth table illustrating combinations of weight data stored in the memory bit circuit, a ternary input provided to the ternary multiply circuit in the first TCC in FIG. 2A-1, and a corresponding ternary product generated in analog form for each combination;

FIG. 2A-3 is a flowchart illustrating a method of multiplying a ternary input value represented by a plurality of binary input signals with a ternary weight data stored in binary form in a TCC including a memory bit circuit as shown in FIG. 2A-1.

FIG. 2B-1 is a schematic view of the first TCC illustrated in FIG. 2A-1 configured to generate a ternary product as a two-bit binary signal in response to a single read-enable signal;

FIG. 2B-2 is a truth table illustrating combinations of weight data stored in the memory bit circuit, a ternary input provided to the ternary multiply circuit in the first TCC in FIG. 2B-1, and a corresponding ternary product generated in two-bit binary form for each combination;

FIG. 3A-1 is a schematic view of a second TCC including a memory bit circuit configured to store weight data and a ternary multiply circuit configured to multiply the stored weight data and a ternary input value received as a plurality of binary input signals and generate a ternary product as an analog signal in response to a single read-enable signal;

FIG. 3A-2 is a truth table illustrating combinations of weight data stored in the memory bit circuit, a ternary input value provided to the ternary multiply circuit in the second TCC in FIG. 3A-1, and a corresponding ternary product generated in analog form for each combination;

FIG. 3B-1 is a schematic view of the second TCC illustrated in FIG. 3A-1 configured to generate a ternary product as a two-bit binary signal in response to a single read-enable signal;

FIG. 3B-2 is a truth table illustrating combinations of weight data stored in the memory bit circuit, a ternary input value provided to the ternary multiply circuit in the second TCC in FIG. 3B-1, and a corresponding ternary product generated in two-bit binary form;

FIG. 4A-1 is a schematic view of a third TCC including a memory bit circuit configured to store weight data and a ternary multiply circuit configured to multiply the stored weight data and a ternary input value received as a plurality of binary input signals and generate a ternary product as an analog signal in response to a single read-enable signal;

FIG. 4A-2 is a truth table illustrating combinations of weight data stored in the memory bit circuit, a ternary input value provided to the ternary multiply circuit in the third TCC in FIG. 4A-1, and a corresponding ternary product generated in analog form for each combination;

FIG. 4B-1 is a schematic view of the third TCC illustrated in FIG. 4A-1 configured to generate a ternary product as a two-bit binary signal in response to a single read-enable signal;

FIG. 4B-2 is a truth table illustrating combinations of weight data stored in the memory bit circuit, a ternary input value provided to the ternary multiply circuit in the third TCC in FIG. 4B-1, and a corresponding ternary product generated in two-bit binary form;

FIG. 5A-1 is a schematic view of a fourth TCC including a memory bit circuit configured to store weight data and a ternary multiply circuit configured to multiply the stored weight data and a ternary input value received as a plurality of binary input signals and generate a ternary product as an analog signal in response to a single read-enable signal;

FIG. 5A-2 is a truth table illustrating combinations of weight data stored in the memory bit circuit, a ternary input value provided to the ternary multiply circuit in the fourth TCC in FIG. 5A-1, and a corresponding ternary product generated in analog form for each combination;

FIG. 5B-1 is a schematic view of the fourth TCC illustrated in FIG. 5A-1 configured to generate a ternary product as a two-bit binary signal in response to a single read-enable signal;

FIG. 5B-2 is a truth table illustrating combinations of weight data stored in the memory bit circuit, a ternary input value provided to the ternary multiply circuit in the fourth TCC in FIG. 5B-1, and a corresponding ternary product generated in two-bit binary form;

FIGS. 7A and 7B are block diagrams of arrays of TCCs, such as in FIGS. 6A and 6B, and circuits configured to control writing weight data to the memory bit circuit of each TCC, reading the weight data stored in each memory bit circuit in the TCC, and generating an output in analog and digital form, respectively, as an accumulation of ternary products of the weight data stored in a column of the array and corresponding ternary input values;

DETAILED DESCRIPTION

Figure 1:
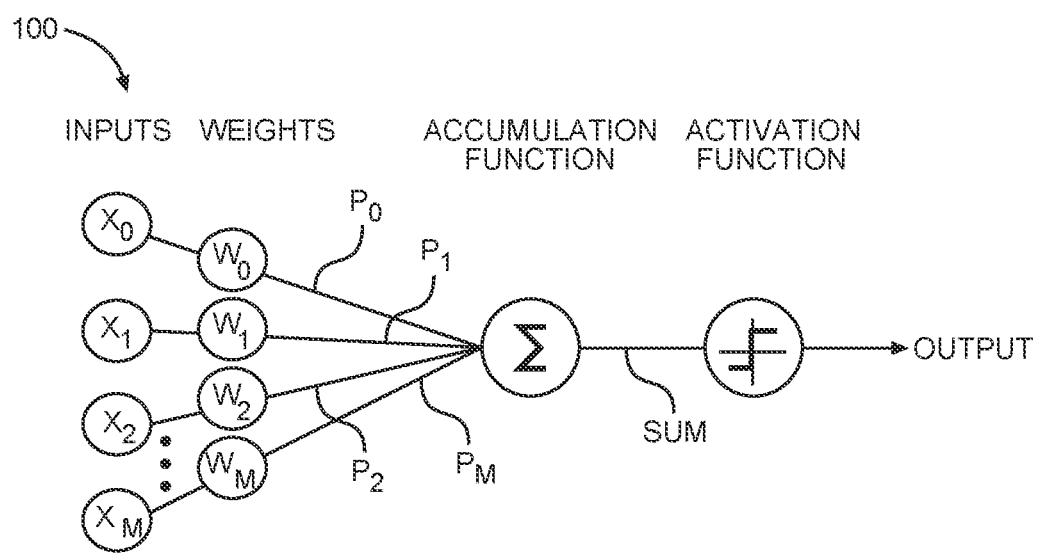
FIG. 1 is a diagram of the operations of a node of a deep neural network (DNN)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Ternary computation memory systems and circuits employing binary bit cell-XNOR circuits particularly suited to deep neural network (DNN) computing are disclosed. DNNs are frameworks of computing nodes in sequential layers with each node performing a multiply-accumulate (MAC) operation to generate an output. A MAC operation consists of multiplying each node input, which is typically in the form of a high-precision floating-point value, by a respective numerical weight data, and summing the products. It has been determined that, for some applications, the accuracy of results of a DNN does not significantly decrease when ternary values are used in place of floating-point values in MAC operations, but utilization of memory, energy, and processing resources significantly decreases. In addition, by representing ternary values in two-bit binary form, a node's MAC operations can be replaced with logic operations (e.g., XNOR, popcount) implemented in logic circuits. Such logic circuits are sufficiently small that they may be integrated into individual memory array elements in which the numerical weight data are stored.

In this regard, a ternary computation circuit (TCC) is disclosed that includes a memory circuit (e.g., bit cell) integrated with a logic circuit. The TCCs can be incorporated as memory elements like bit cells in a memory array. The logic circuits in each TCC use a logic operation (e.g., XNOR logic operation) to multiply a ternary input value by the numerical weight data stored in the memory circuit. A TCC employing a single read-enable signal is made possible by a balanced logic circuit to perform the XNOR logic operation. A memory array including TCCs performs a plurality of parallel operations (e.g., column or row elements) and determines a popcount (e.g., number of bits set to "1"), which corresponds to an accumulate operation. A semiconductor device implementing a TCC array can reduce response times of neural network applications compared to conventional processing devices. In addition, a TCC array in which logic circuits in columns or rows employ a single read-enable signal can reduce routing complexity and congestion of a metal layer in a semiconductor device.

Figures 2, 2A, 3:
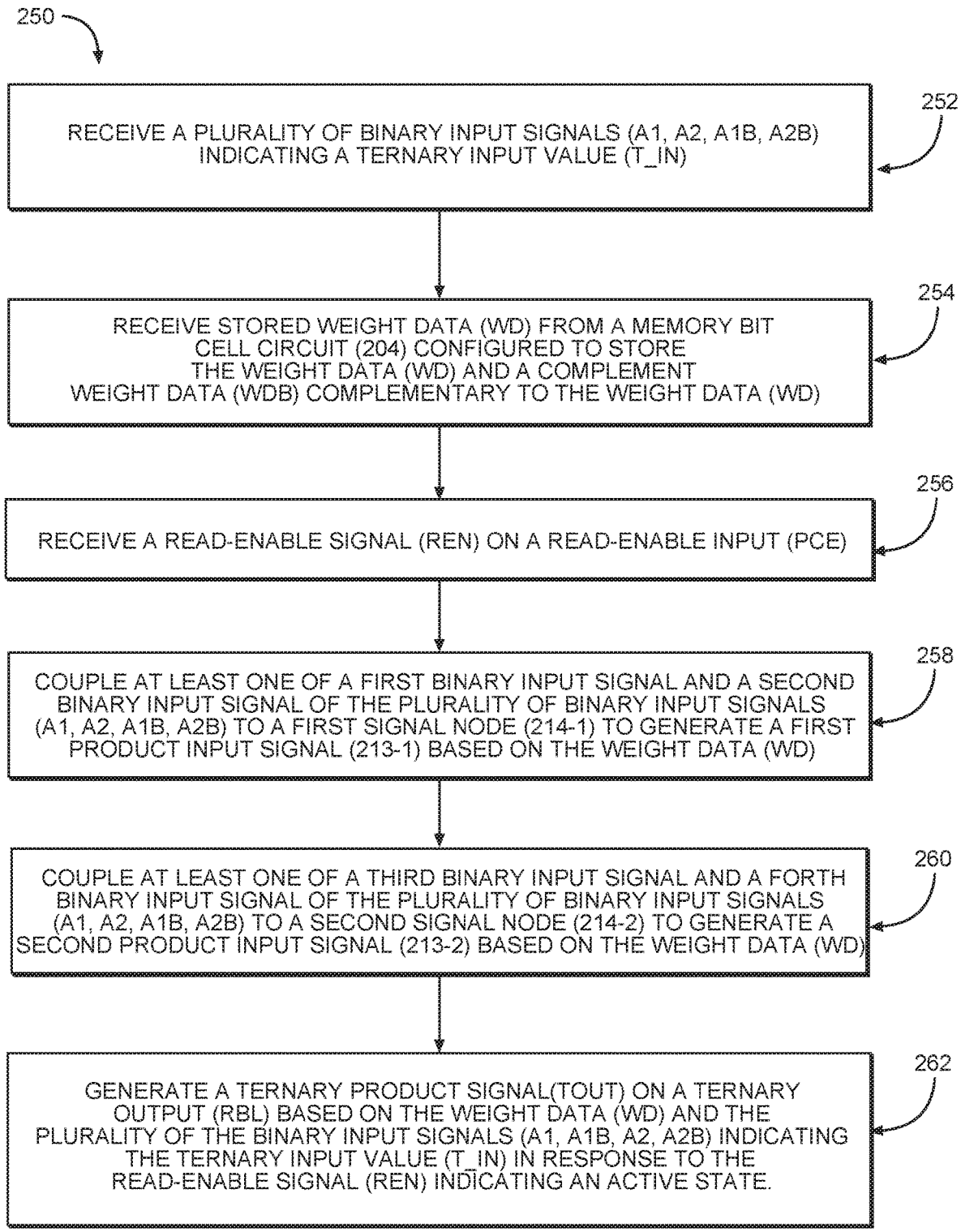

In this regard, operation of the example of TCC 200A in FIG. 2A-1 is explained below with reference to Table 202A in FIG. 2A-2. The TCC 200A includes a memory bit cell circuit 204, referred to herein as memory bit circuit 204, and a ternary multiply circuit 206A. The memory bit circuit 204 is configured to store weight data WD and complement weight data WDB. The ternary multiply circuit 206A is configured to multiply a ternary input value T_IN by a ternary weight data T_WT, which is stored as a binary weight data WD in the memory bit circuit 204, to generate a ternary product signal TOUT on a ternary output RBL in response to a single read-enable signal REN indicating an active state. The ternary input value T_IN in the examples herein takes one of the values "−1," "0," and "+1." Representing the three possible states of the ternary input value T_IN in digital circuitry requires two binary bits. Thus, the ternary input value T_IN received by the ternary multiply circuit 206A is represented by two binary input signals A1 and A2. The ternary multiply circuit 206A also receives the complement binary input signals A1B and A2B, respectively, of the two binary input signals A1, A2. With regard to the ternary weight data T_WT, since a "0" weight data multiplied by any input signal would nullify that input signal, the quantized values used for the ternary weight data T_WT are limited to "+1" and "−1."

This simplification is beneficial in two aspects. First, since there are only two possible values, ternary weight data T_WT may be stored as a single binary bit as weight data WD in the memory bit circuit 204. Second, multiplication of the ternary input value T_IN and the ternary weight data T_WT can be simplified. In cases in which the ternary input value T_IN is "0," the ternary weight data T_WT does not need to be considered. The Table 202A includes rows illustrating the combinations of T_IN corresponding to a ternary weight data T_WT of "0" for completeness, but those combinations are not implemented, so they are marked out in Table 202A and are not further discussed herein. The remaining possible multiplicands that are considered for multiplication in the ternary multiply circuit 206A are "−1" or "+1" for the ternary input value T_IN and "−1" or "+1" for the ternary weight data T_WT. A multiplication table corresponding to these possibilities shows that the ternary product is a "−1" in cases in which the multiplicands (i.e., T_IN and T_WT) differ, and a "+1" in cases in which the multiplicands are the same. Recognizing that this pattern corresponds to the pattern of a truth table for an XNOR binary logic operator, and the respective multiplicands are stored in binary form (e.g., the ternary input value T_IN and the ternary weight data T_WT are both available in binary form), ternary multiplication of the ternary input value T_IN and the ternary weight data T_WT is implemented by digital circuitry performing binary operations on the binary input signal A1, the complement binary input signal A1B, the binary input signal A2, and the complement binary input signal A2B, which indicate the ternary input value T_IN and at least one of the weight data WD and the complement weight data WDB. For example, the ternary multiply circuit 206A may be configured to multiply the ternary input value T_IN and the weight data WD by an XNOR operation involving the binary input signals A1, A2, the complement binary input signals A1B, A2B, and the weight data WD and the complement weight data WDB.

As noted above, two binary bits must be used to represent the three possible ternary input values. A binary "11" on the binary input signals A1, A2 is chosen to represent ternary "+1," and a binary "00" is chosen to represent ternary "−1." Since possible combinations of the two binary bits A1, A2 also include "01" and "10," both of these combinations represent ternary "0." Thus, the binary input signals A1, A2 and their complement binary input signals A1B, A2B are received in the TCC 200A. The ternary weight data T_WT having a value of "+1" could be stored in the memory bit circuit 204 as a binary "1," and a ternary value of "−1" could be stored as a binary "0," or vice versa. The binary form of data stored in the memory bit circuit 204, which represents the ternary weight data T_WT, may be referred to herein as weight data WD.

As noted above, the ternary multiply circuit 206A performs the multiplication of the ternary input value T_IN and the ternary weight data T_WT as a logical XNOR operation of A1, A2 and WD. The complement values A1B, A2B, and WDB may also be employed by the ternary multiply circuit 206A. The ternary multiply circuit 206A receives the weight data WD from the memory bit circuit 204 on a data line 208T and receives the complement weight data WDB on a complement data line 208C. The ternary multiply circuit 206A receives the ternary input value T_IN in the form of input signals A1, A2, A1B, and A2B on inputs IN1B, IN1T, IN2B, and IN2T. In the ternary multiply circuit 206A, the ternary product is generated in response to a single read-enable signal REN provided to the TCC 200A indicating an active state. An active state on the read-enable signal REN indicates that the ternary product is to be generated and read from the TCC. An active state may be indicated as a voltage level such as a higher voltage level (e.g., VDD or one volt (1V)) on the read-enable input PCE, and an inactive state of the read-enable signal REN may be indicated by a lower voltage level (e.g., VSS, 0 V, or ground). However, the opposite voltage levels may be used to indicate the active and inactive states of the read-enable signal REN.

Operation of the TCC 200A in FIG. 2A-1 is explained with reference to Table 202A in FIG. 2A-2. A ternary product signal TOUT is an analog signal generated on the ternary output RBL of the ternary multiply circuit 206A in response to the read-enable signal REN received on the read-enable input PCE indicating the active state. The Table 202A includes a first column of values of the ternary input value T_IN (outside the parentheses) and corresponding values of the binary input signals A1, A2 (inside the parentheses). The Table 202A also includes a column of values of the ternary weight data T_WT (outside the parentheses) and the corresponding binary weight data WD and the complement weight data WDB (inside the parentheses). The Table 202A also includes a column of values of the ternary product signal TOUT generated on the ternary output RBL based on the ternary input value T_IN and ternary weight data T_WT in response to the read-enable signal REN being asserted, as explained below.

As an example, in the top row, ternary input value T_IN is "+1" and the corresponding binary input signals A1, A2 representing this value are "1, 1." The ternary weight data T_WT is "+1" and the corresponding binary weight data WD and complement weight data WDB are "1,0." The ternary output RBL of the ternary multiplication of "+1" with "+1" is "+1." Since the ternary output RBL is an analog value, the "1" inside the parentheses is not a binary value. Rather, as a ternary value, the ternary output RBL must represent the three states of the ternary product signal TOUT. Here, the ternary output RBL indicated as "1" inside the parentheses is indicated by a higher voltage (e.g., VDD). The ternary product signal TOUT having a value of "−1" is represented by the ternary output RBL having a value of "0," which is indicated by a lower voltage (e.g., 0 V, VSS, or ground). The ternary product signal TOUT having a value of "0" is represented by the ternary output RBL having a value of "½," which is indicated by a middle voltage level MID between the upper and lower voltage (e.g., approximately ½ of VDD or 0.5 V).

Referring back to the example of TCC 200A in FIG. 2A-1, the memory bit circuit 204 in FIG. 2A-1 may be a static random access memory (SRAM) bit circuit, such as a 6 transistor (T) (6T) SRAM bit circuit. In the example in FIG. 2A-1, a bit line BL and a complement bit line BLB of the memory bit circuit 204 may be used to access (e.g., read or write) the weight data WD and the complement weight data WDB, respectively, through pass-gates PT and PC under the control of a word line WL. The weight data WD and the complement weight data WDB may be stored in cross-coupled inverters 210T and 210C coupled between a pull-up supply voltage VDD and a pull-down supply voltage VSS in the memory bit circuit 204.

The ternary multiply circuit 206A includes a first control circuit 212-1 and a second control circuit 212-2. The weight data WD received over the data line 208T is provided to the first control circuit 212-1, and the complement weight data WDB received over the complement data line 208C is provided to the second control circuit 212-2. The ternary multiply circuit 206A includes a plurality of inputs configured to receive input signals. The first control circuit 212-1 includes inputs IN1T and IN1B, and the second control circuit 212-2 includes inputs IN2T and IN2B. In the TCC 200A, the input IN1T receives the complement input signal A1B, the input IN1B receives the input signal A1, the input IN2T receives the input signal A2, and the input IN2B receives the complement input signal A2B. The first control circuit 212-1 is configured to couple at least one of the complement input signal A1B and the input signal A1 to a first signal node 214-1 to generate a first product input signal 213-1 based on the weight data WD. The second control circuit 212-2 is configured to couple at least one of the input signal A2 and the complement input signal A2B to a second signal node 214-2 to generate a second product input signal 213-2 based on the complement weight data WDB.

The first control circuit 212-1 in the ternary multiply circuit 206A includes a first transistor 216-1 serially coupled to a second transistor 218-1 at the first signal node 214-1. Herein, "serially coupled" indicates that a source or drain of first transistor 216-1 is coupled to a source or drain of the second transistor 218-2 such that, if both of the first transistor 216-1 and the second transistor 218-1 are enabled or turned on, a current may flow through the first transistor 216-1 and the second transistor 218-1. The first transistor 216-1 may be a first type (e.g., N-type) transistor and the second transistor 218-1 may be a second type (e.g., P-type) transistor. Herein, an N-type transistor may be referred to as an opposite type to a P-type transistor, and a P-type transistor may be referred to as an opposite type to an N-type transistor. A gate G of the first transistor 216-1 and a gate G of the second transistor 218-1 may each be coupled to the data line 208T such that the weight data WD controls the first and second transistors 216-1 and 218-1. The second control circuit 212-2 includes a third transistor 216-2 serially coupled to a fourth transistor 218-2 at the second signal node 214-2. The third transistor 216-2 may be the first type transistor, and the fourth transistor 218-2 may be the second type transistor. A gate G of the third transistor 216-2 and a gate G of the fourth transistor 218-2 may be coupled to the complement data line 208C such that the complement weight data WDB controls the third and fourth transistors 216-2 and 218-2.

Operation of the ternary multiply circuit 206A in view of the input combination shown in the top row of Table 202A is described with reference to the binary input signals A1, A2 and weight data WD. The complement input signal A1B having a value of binary "0" is received on the input IN1T, the input signal A1 having a value of binary "1" is received on the input IN1B, the input signal A2 having a value of binary "1" is received on the input IN2T, and the complement input signal A2B having a value of binary "0" is received on the input IN2B. Weight data WD with a binary value of "1" received at the gate G of the first transistor 216-1 turns on the first transistor 216-1, which allows the binary "1" of input signal A1 on input IN1B to be coupled to the first signal node 214-1. The weight data WD with a value of binary "1" received at the gate G of the second transistor 218-1 keeps the second transistor 218-1 turned off. Complement weight data WDB with a value of binary "0" received at the gate G of the third transistor 216-2 keeps the third transistor 216-2 turned off, and the binary "0" received at the gate G of the fourth transistor 218-2 turns on the fourth transistor 218-2, which allows the binary "1" of the input signal A2 on input IN2T to be coupled to the second signal node 214-2. With a binary "1" at each of the first signal node 214-1 and the second signal node 214-2, a higher voltage analog signal corresponding to the binary "1" is generated on the ternary output RBL in response to the read-enable signal REN being asserted. Operation of the ternary multiply circuit 206A in other input combinations shown in the Table 202A may be understood by a similar analysis.

The first transistor 216-1 of the first control circuit 212-1 includes a first source/drain region D coupled to the first signal node 214-1 and a second source/drain region S coupled to the input IN1B. The second transistor 218-1 of the first control circuit 212-1 includes a first source/drain region D coupled to the first signal node 214-1 and a second source/drain region S coupled to the input IN1T. The third transistor 216-2 of the second control circuit 212-2 includes a first source/drain region D coupled to the second signal node 214-2 and a second source/drain region S coupled to the input IN2B. The fourth transistor 218-2 of the second control circuit 212-2 includes a first source/drain region D coupled to the second signal node 214-2 and a second source/drain region S coupled to the input IN2T.

A product circuit 220A is coupled to the first signal node 214-1 and the second signal node 214-2 and is configured to generate the ternary product signal TOUT on the ternary output RBL based on both of the first product input signal 213-1 and the second product input signal 213-2 in response to the read-enable signal REN received on the read-enable input PCE indicating an active state (e.g., a read-enable operation). In particular, the product circuit 220A includes a first pass-gate transistor 222-1 of the first type (e.g., N-type or P-type) and a second pass-gate transistor 222-2 of the first type. A gate G of the first pass-gate transistor 222-1 and a gate G of the second pass-gate transistor 222-2 may be coupled together and coupled to the read-enable input PCE to receive the read-enable signal REN. The first pass-gate transistor 222-1 includes a first source/drain region S coupled to the first signal node 214-1 and a second source/drain region D coupled to the ternary output RBL. The second pass-gate transistor 222-2 includes a first source/drain region S coupled to the second signal node 214-2 and a second source/drain region D coupled to the ternary output RBL. Thus, in the TCC 200A, the second source/drain region D of the first pass-gate transistor 222-1 is coupled to the second source/drain region D of the second pass-gate transistor 222-2, and the ternary product signal TOUT is an analog signal generated on the ternary output RBL based on the first product input signal 213-1 and the second product input signal 213-2 in response to the read-enable signal REN indicating an active state, such as being asserted at a higher voltage (e.g., 1 V). Since both of the first and second pass-gate transistors 222-1 and 222-2 are of a first type (e.g., N-type), both of the pass-gate transistors 222-1 and 222-2 may be turned on in response to the read-enable signal REN indicating an active state by the higher voltage. In an alternative example, both of the pass-gate transistors 222-1 and 222-2 may be turned on in response to the read-enable signal REN indicating an active state by a lower voltage.

When the read-enable signal REN turns on both of the pass-gate transistors 222-1 and 222-2, the ternary output RBL is coupled to the first signal node 214-1 of the first control circuit 212-1 and to the second signal node 214-2 of the second control circuit 212-2. Thus, a voltage level on the ternary output RBL depends on a voltage level of the first product input signal 213-1 on the first signal node 214-1 and the voltage level of the second product input signal 213-2 on the second signal node 214-2. If both of the first signal node 214-1 and the second signal node 214-2 are at the higher voltage, the higher voltage is generated on the ternary output RBL. The higher voltage in the example in FIG. 2A-1 may be 1 V, but other voltages are possible. If both of the first signal node 214-1 and the second signal node 214-2 are at the lower voltage, the lower voltage is generated on the ternary output RBL. The lower voltage in the example in FIG. 2A-1 may be 0 V or ground, but other voltages lower than the higher voltage are possible. However, if one of the first signal node 214-1 and the second signal node 214-2 has the higher voltage, while the other one of the first signal node 214-1 and the second signal node 214-2 has the lower voltage, a middle voltage MID (e.g., a voltage approximately half way between the higher voltage and the lower voltage) may be generated on the ternary output RBL. For example, if the higher voltage is 1 V, and the lower voltage is 0 V, the middle voltage MID may be approximately 0.5 V, or in a range from about 0.4 V to about 0.6 V, for example. An analog circuit (not illustrated) external to the TCC 200A may be coupled to the ternary output RBL to detect the ternary product signal TOUT as a "+1," "0," or "−1" by determining if the voltage level of the ternary output RBL is 1, 0.5, or 0 V, respectively, for example.

FIG. 2A-3 is a flowchart illustrating a method 250 of multiplying the ternary input value T_IN with the stored weight data T_WT. The method 250 includes receiving the plurality of binary input signals (A1, A2, A1B, and A2B) indicating the ternary input value T_IN (block 252, FIG. 2A-3), receiving the stored weight data T_WT from the memory bit circuit 204 configured to store the weight data WD and the complement weight data WDB complementary to the weight data WD (block 254, FIG. 2A-3), and receiving the read-enable signal REN on the read-enable input PCE (block 256, FIG. 2A-3). The method 250 includes coupling at least one of a first binary input signal and a second binary input signal of the plurality of binary input signals (A1, A2, A1B, and A2B) to the first signal node 214-1 to generate the first product input signal 213-1 based on the weight data WD (block 258, FIG. 2A-3). The method 250 includes coupling at least one of a third binary input signal and a fourth binary input signal of the plurality of binary input signals (A1, A2, A1B, and A2B) to the second signal node 214-2 to generate the second product input signal 213-2 based on the weight data WD (block 260, FIG. 2A-3). The method 250 also includes generating the ternary product signal TOUT on the ternary output RBL based on the weight data WD and the plurality of binary input signals (A1, A2, A1B, and A2B) indicating the ternary input value T_IN in response to the read-enable signal REN indicating an active state (block 262, FIG. 2A-3).

In this regard, by representing the ternary input value T_IN with binary values and storing the ternary weight data T_WT having a ternary value of "+1" or "−1 in the memory bit circuit 204, a product may be generated by an equivalent XNOR operation in response to a single read-enable signal REN indicating an active state provided to the TCC 200A in FIG. 2A-1. The TCC 200A does not include a second read-enable input so the TCC 200A does not receive a second read-enable signal having a different voltage than the single read-enable signal REN to cause, by itself or in conjunction with the read-enable signal REN, the product circuit 220A to generate the ternary product signal TOUT on the ternary output RBL.

Figures 1, 2, 2B:
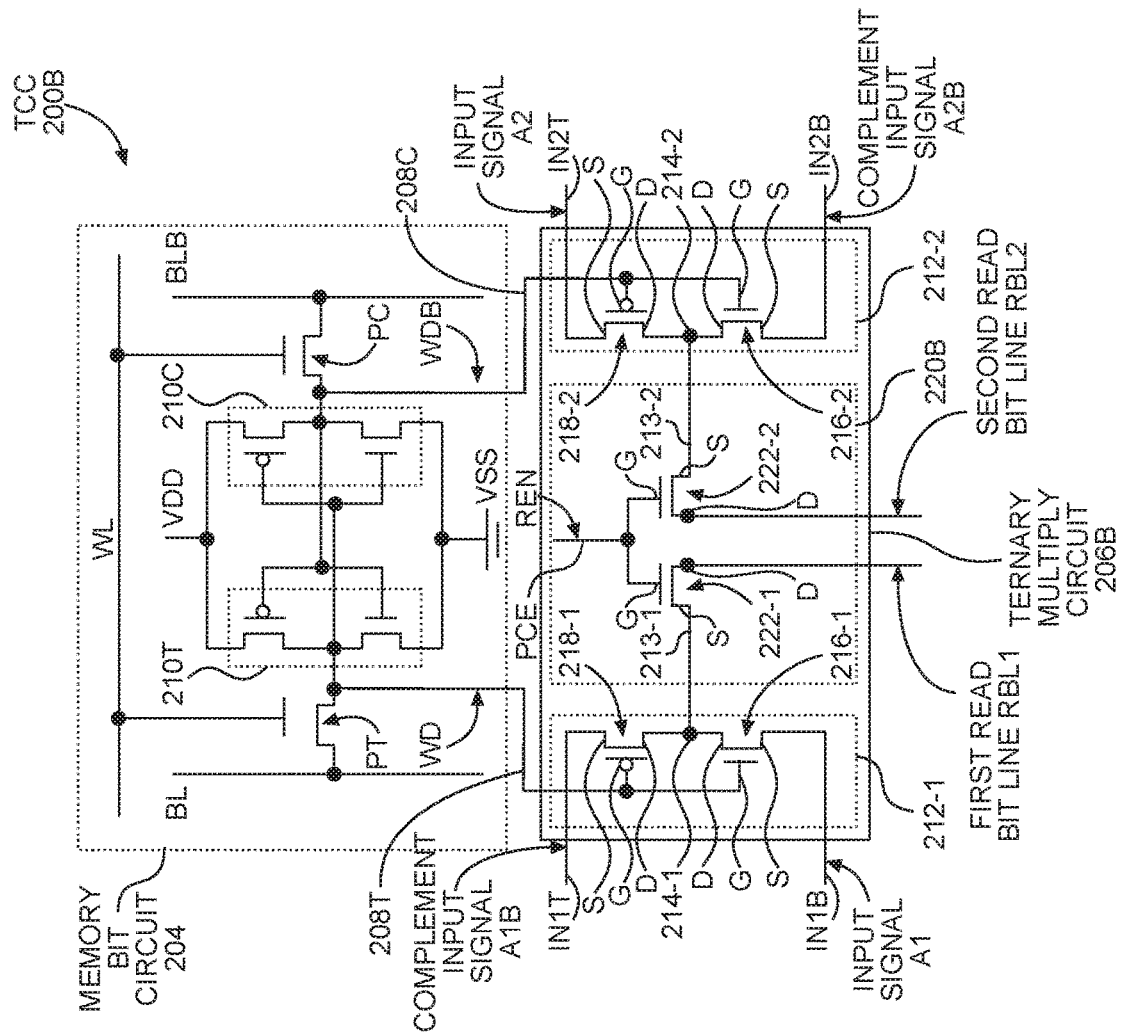

In another example, a TCC 200B is illustrated in FIG. 2B-1, and operation thereof is illustrated in the Table 202B in FIG. 2B-2. Features of the TCC 200B in FIG. 2B-1 corresponding to features in the TCC 200A in FIG. 2A-1 are commonly labeled, and descriptions thereof may not be repeated. The TCC 200B includes a ternary multiply circuit 206B with the first and second control circuits 212-1 and 212-2. In the TCC 200B, operation of the first control circuit 212-1 and the second control circuit 212-2 is the same as in the TCC 200A, and the first and second control circuits 212-1 and 212-2 in the TCC 200B are coupled to the same inputs as in the TCC 200A, so the first and second control circuits 212-1 and 212-2 of the TCC 200B provide the same first product input signal 213-1 and the same second product input signal 213-2 that are generated at the first and second signal nodes 214-1 and 214-2, respectively, in the TCC 200A. However, the ternary multiply circuit 206B includes a product circuit 220B coupled to the first signal node 214-1 and the second signal node 214-2. In contrast to generating the ternary product signal TOUT as an analog signal based on both of the first product input signal 213-1 and the second product input signal 213-2 on the ternary output RBL, the product circuit 220B is configured to generate the ternary product signal TOUT as a two-bit binary signal with the first and second product input signals 213-1 and 213-2 provided on first and second read bit lines RBL1 and RBL2, respectively, in response to the read-enable signal REN received on the read-enable input PCE indicating an active state.

In particular, the product circuit 220B includes the first pass-gate transistor 222-1 of the first type (e.g., N-type) and the second pass-gate transistor 222-2 of the first type. The gate G of the first pass-gate transistor 222-1 and the gate G of the second pass-gate transistor 222-2 may be coupled to the read-enable input PCE to receive the read-enable signal REN. The first pass-gate transistor 222-1 includes a first source/drain region S coupled to the first signal node 214-1, and the second pass-gate transistor 222-2 includes a first source/drain region S coupled to the second signal node 214-2. However, the second source/drain region D of the first pass-gate transistor 222-1 and the second source/drain region D of the second pass-gate transistor 222-2 are not coupled to each other. Instead, in the TCC 200B, the second source/drain region D of the first pass-gate transistor 222-1 is coupled to the first read bit line RBL1, and the second source/drain region D of the second pass-gate transistor 222-2 is coupled to the second read bit line RBL2, such that the ternary product signal TOUT is generated as a two-bit binary signal on the first and second read bit lines RBL1 and RBL2. Since both of the first and second pass-gate transistors 222-1 and 222-2 are of a first type (e.g., N-type), both of the pass-gate transistors 222-1 and 222-2 are turned on in response to the read-enable signal REN having a higher voltage (e.g., binary "1"). The binary values of the first and second read bit lines RBL1 and RBL2, corresponding to the ternary product signal TOUT outside the parentheses, are shown inside the parentheses in the last column in Table 202B.

The TCC 200B does not include a second read-enable input, so the TCC 200B does not receive a second read-enable signal having a different voltage than the single read-enable signal REN to cause, by itself or in conjunction with the read-enable signal REN, the product circuit 220B to generate the ternary product signal TOUT on the read bit lines RBL1 and RBL2.

Figures 1, 2, 3A:
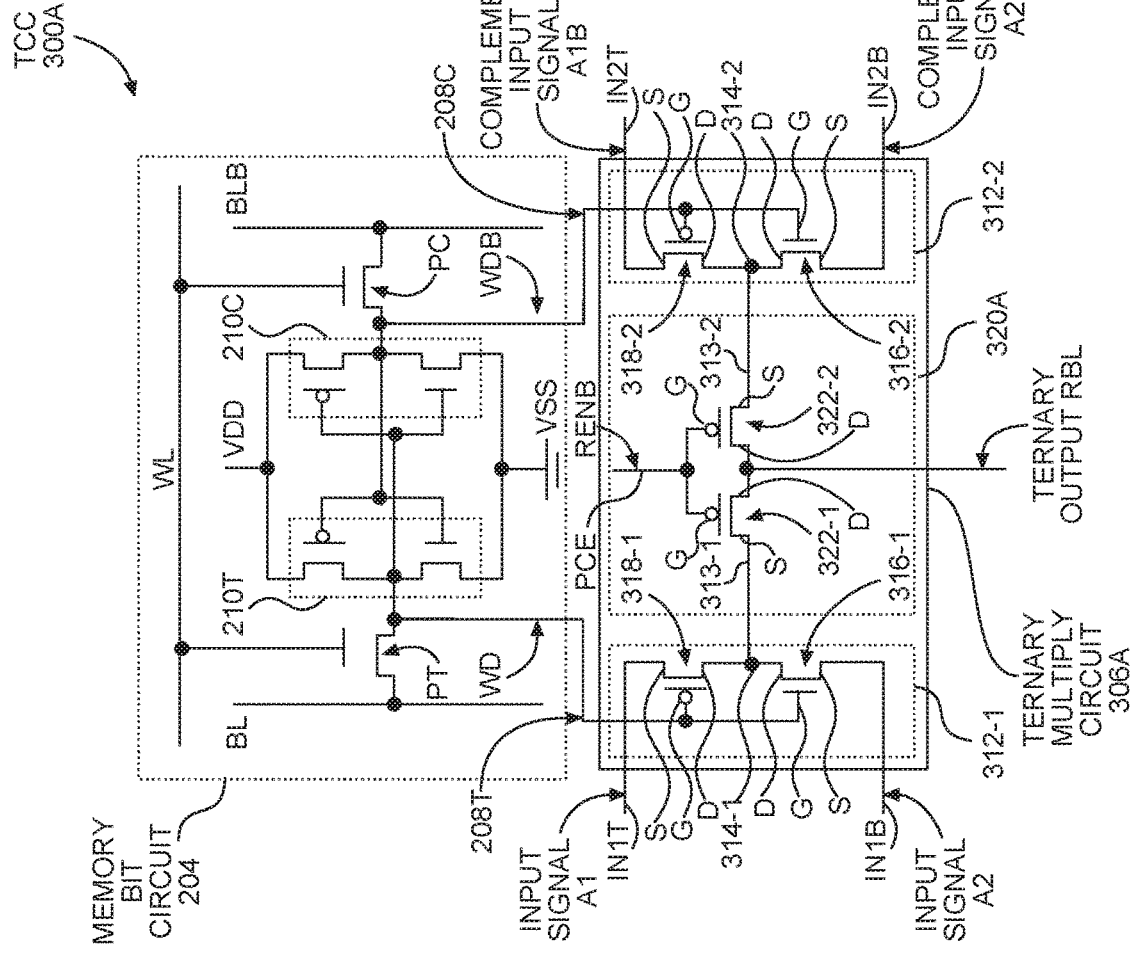

In another example, a TCC 300A is illustrated in FIG. 3A-1, and operation thereof is illustrated in the Table 302A in FIG. 3A-2. Features of the TCC 300A in FIG. 3A-1 corresponding to features in the TCC 200A in FIG. 2A-1 are commonly labeled, and descriptions thereof may not be repeated. The TCC 300A includes a ternary multiply circuit 306A, which includes first and second control circuits 312-1 and 312-2 and a product circuit 320A. The weight data WD may be received over the data line 208T and provided to the first control circuit 312-1, and the complement weight data WDB may be received over the complement data line 208C and provided to the second control circuit 312-2. The first control circuit 312-1 includes inputs IN1T and IN1B. In the TCC 300A, the input IN1T receives the input signal A1 and the input IN1B receives the input signal A2. The first control circuit 312-1 is configured to couple both or neither of the input signal A1 and the input signal A2 to a first signal node 314-1 to generate a first product input signal 313-1 based on the weight data WD. Similarly, the second control circuit 312-2 includes inputs IN2T and IN2B. In the TCC 300A, the input IN2T receives the complement input signal A1B, and the input IN2B receives the complement input signal A2B. The second control circuit 312-2 is configured to couple both or neither of the complement input signal A1B and the complement input signal A2B to a second signal node 314-2 to generate a second product input signal 313-2 based on the complement weight data WDB.

The first control circuit 312-1 in the ternary multiply circuit 306A includes a first transistor 316-1 serially coupled to a second transistor 318-1 at the first signal node 314-1. The first transistor may 316-1 and the second transistor 318-1 may both be a first type (e.g., N-type) transistor. A gate G of the first transistor 316-1 and a gate G of the second transistor 318-1 may each be coupled to the data line 208T such that the weight data WD controls the first and second transistors 316-1 and 318-1. The second control circuit 312-2 includes a third transistor 316-2 serially coupled to a fourth transistor 318-2 at the second signal node 314-2. The third transistor 316-2 and the fourth transistor 318-2 may both be the first type transistor. A gate G of the third transistor 316-2 and a gate G of the fourth transistor 318-2 may be coupled to the complement data line 208C such that the complement weight data WDB controls the third and fourth transistors 316-2 and 318-2.

The first transistor 316-1 of the first control circuit 312-1 includes a first source/drain region D coupled to the first signal node 314-1 and a second source/drain region S coupled to the input IN1B. The second transistor 318-1 of the first control circuit 312-1 includes a first source/drain region D coupled to the first signal node 314-1 and a second source/drain region S coupled to the input IN1T. The third transistor 316-2 of the second control circuit 312-2 includes a first source/drain region D coupled to the second signal node 314-2 and a second source/drain region S coupled to the input IN2B. The fourth transistor 318-2 of the second control circuit 312-2 includes a first source/drain region D coupled to the second signal node 314-2 and a second source/drain region S coupled to the input IN2T.

The product circuit 320A is coupled to the first signal node 314-1 and the second signal node 314-2 and is configured to generate the ternary product signal TOUT on the ternary output RBL based on both of the first product input signal 313-1 and the second product input signal 313-2 in response to a read-enable signal RENB indicating an active state received on the read-enable input PCE. Thus, in the TCC 300A, the ternary product signal TOUT is generated on the ternary output RBL in response to the read-enable signal RENB having a lower voltage (e.g., 0 V). In particular, the product circuit 320A includes a first pass-gate transistor 322-1 of the second type (e.g., P-type) and a second pass-gate transistor 322-2 of the second type. A gate G of the first pass-gate transistor 322-1 and a gate G of the second pass-gate transistor 322-2 may be coupled to the read-enable input PCE to receive the read-enable signal RENB. The first pass-gate transistor 322-1 includes a first source/drain region S coupled to the first signal node 314-1 and a second source/drain region D coupled to the ternary output RBL. The second pass-gate transistor 322-2 includes a first source/drain region S coupled to the second signal node 314-2 and a second source/drain region D coupled to the ternary output RBL. Thus, in the TCC 300A, the second source/drain region D of the first pass-gate transistor 322-1 is coupled to the second source/drain region D of the second pass-gate transistor 322-2, and the ternary product signal TOUT is an analog signal generated on the ternary output RBL in response to the read-enable signal RENB indicating an active state at a lower voltage. Since both of the first and second pass-gate transistors 322-1 and 322-2 are of the second type (e.g., P-type), both of the pass-gate transistors 322-1 and 322-2 are turned on in response to the single read-enable signal RENB having the lower voltage (e.g., 0 V).

When the read-enable signal RENB turns on both of the pass-gate transistors 322-1 and 322-2, the ternary output RBL is coupled to the first product input signal 313-1 on the first signal node 314-1 of the first control circuit 312-1 and to the second product input signal 313-2 on the second signal node 314-2 of the second control circuit 312-2. Thus, a voltage level on the ternary output RBL depends on a voltage level of the first signal node 314-1 and the second signal node 314-2. An analog circuit (not illustrated) external to the TCC 300A may be coupled to the ternary output RBL to detect the ternary product signal TOUT by determining a voltage level of the ternary output RBL.

Operation of the TCC 300A of FIG. 3A-1 is illustrated by the Table 302A of FIG. 3A-2. Operation of the ternary multiply circuit 306A in view of the input combination shown in the top row of Table 302A is described with reference to the binary input signals A1, A2 and weight data WD. The input signal A1 having a value of binary "1" is received on input IN1T, the input signal A2 having a value of binary "1" is received on input IN1B, the input signal A1B having a value of binary "0" is received on input IN2T, and the input signal A2B having a value of binary "0" is received on input IN2B. Weight data WD having a value of binary "1" received at the gate G of the first transistor 316-1 turns on the first transistor 316-1 and at the gate G of the second transistor 318-1 turns on the second transistor 318-1 of the first control circuit 312-1. Since a binary "1" is coupled to the first signal node 314-1 by both of the first transistor 316-1 and the second transistor 318-1, the first signal node 314-1 has a value of binary "1." Complement weight data WDB having a value of binary "0" received at the gate G of the third transistor 316-2 and the gate G of the fourth transistor 318-2 turns off both of the third transistor 316-2 and the fourth transistor 318-2 of the second control circuit 312-2, so the second signal node 314-2 remains floating, not driven to any voltage. With a binary "1" at the first signal node 314-1 and the second signal node 314-2 floating, a higher voltage analog signal corresponding to the binary "1" (and ternary "+1") is generated on the ternary output RBL in response to the read-enable signal RENB being asserted at the lower voltage (e.g., 0 V). Operation of the ternary multiply circuit 306A with other input combinations is understood by a similar analysis.

In this regard, by representing the ternary input value T_IN with binary values, and storing the ternary weight data T_WT having a ternary value of "+1" or "−1" in the memory bit circuit 204, a product may be generated by an equivalent XNOR operation in response to a single read-enable signal RENB provided to the TCC 300A in FIG. 3A-1. The TCC 300A does not include a second read-enable input so the TCC 300A does not receive a second read-enable signal having a different voltage than the single read-enable signal RENB to cause, by itself or in conjunction with the read-enable signal RENB, the product circuit 320A to generate the ternary product signal TOUT on the ternary output RBL.

Figures 1, 2, 3B:
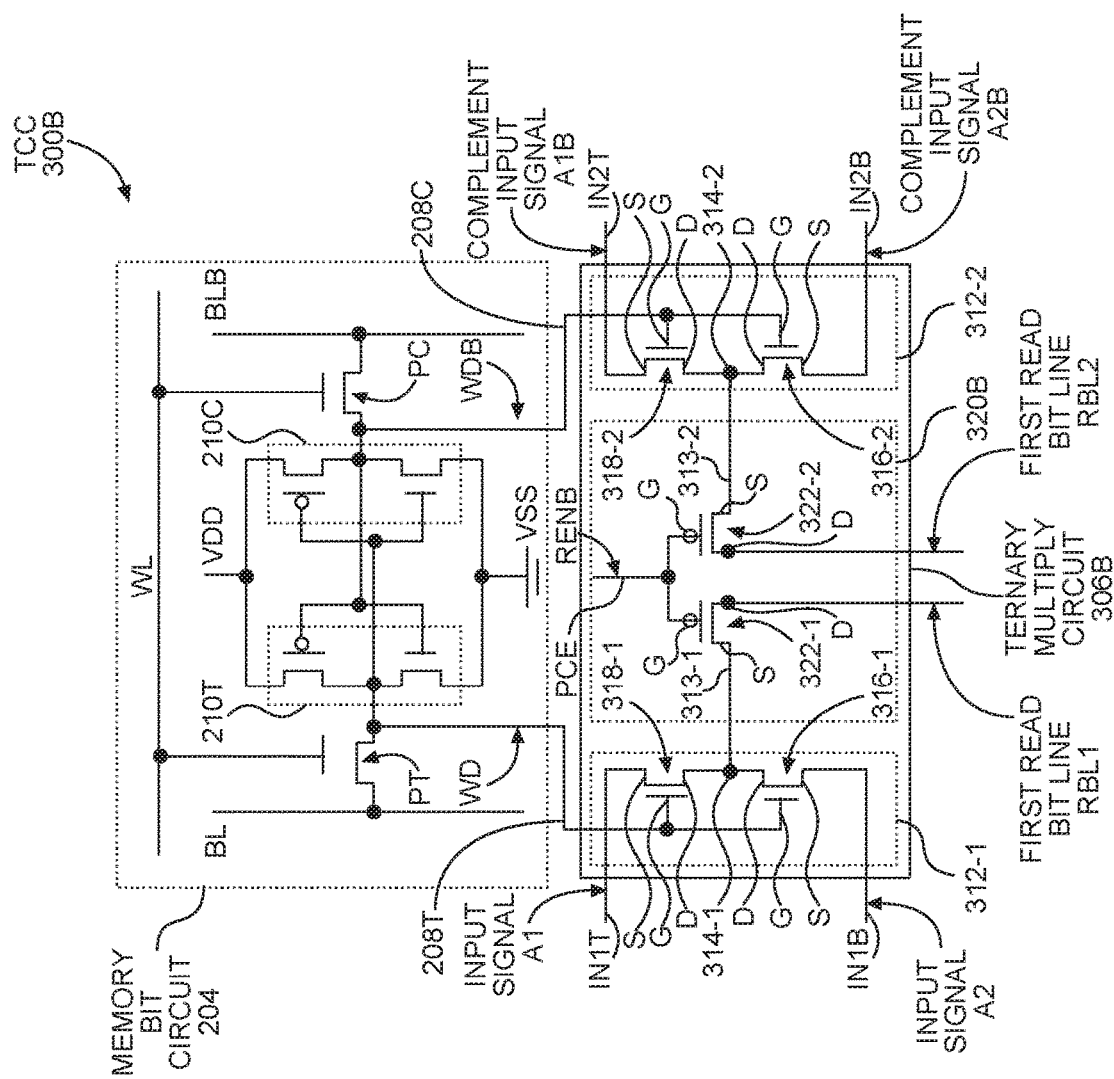

In another example, a TCC 300B is illustrated in FIG. 3B-1, and operation thereof is illustrated in the Table 302B in FIG. 3B-2. Features of the TCC 300B in FIG. 3B-1 corresponding to features in the TCC 300A in FIG. 3A-1 are commonly labeled, and descriptions thereof may not be repeated. The TCC 300B includes a ternary multiply circuit 306B with the first and second control circuits 312-1 and 312-2. In the TCC 300B, operation of the first control circuit 312-1 and the second control circuit 312-2 is the same as in the TCC 300A, and the first and second control circuits 312-1 and 312-2 in the TCC 300B are coupled to the same inputs as in the TCC 300A, so the first and second control circuits 312-1 and 312-2 in TCC 300B provide the same first product input signal 313-1 and second product input signal 313-2 that are generated at the first and second signal nodes 314-1 and 314-2 of the TCC 300A. However, the ternary multiply circuit 306B includes a product circuit 320B coupled to the first signal node 314-1 and the second signal node 314-2. In contrast to generating the ternary product signal TOUT as an analog signal on the ternary output RBL based on both of the first product input signal 313-1 and the second product input signal 313-2, as in the product circuit 320A in the TCC 300A, the product circuit 320B is configured to generate a ternary product signal TOUT as a two-bit binary signal with the first and second product input signals 313-1 and 313-2 provided on the first and second read bit lines RBL1 and RBL2, respectively, in response to the read-enable signal RENB received on the read-enable input PCE indicating an active state.

In particular, the product circuit 320B includes the first pass-gate transistor 322-1 of the second type (e.g., P-type) and the second pass-gate transistor 322-2 of the second type. The gate G of the first pass-gate transistor 322-1 and the gate G of the second pass-gate transistor 322-2 may be coupled to the read-enable input PCE to receive the read-enable signal RENB. The first pass-gate transistor 322-1 includes a first source/drain region S coupled to the first signal node 314-1, and the second pass-gate transistor 322-2 includes a first source/drain region S coupled to the second signal node 314-2. However, the second source/drain region D of the first pass-gate transistor 322-1 and the second source/drain region D of the second pass-gate transistor 322-2 are not coupled to each other at the ternary output RBL. Instead, in the TCC 300B, the second source/drain region D of the first pass-gate transistor 322-1 is coupled to the first read bit line RBL1, and the second source/drain region D of the second pass-gate transistor 322-2 is coupled to the second read bit line RBL2, such that the ternary product signal TOUT is generated as a two-bit binary signal with the first and second product input signals 313-1 and 313-2 provided on the first and second read bit lines RBL1 and RBL2. Since both of the first and second pass-gate transistors 322-1 and 322-2 are of the second type (e.g., P-type), both of the pass-gate transistors 322-1 and 322-2 are turned on in response to the read-enable signal RENB indicating an active state at a lower voltage (e.g., binary "0"). The binary values of the first and second read bit lines RBL1 and RBL2 are shown inside the parentheses in the last column in Table 302B. The two-bit binary values of the first and second read bit lines RBL1 and RBL2 may be translated to ternary values "+1," "−1," and "0" as discussed above.

The TCC 300B does not include a second read-enable input, so the TCC 300B does not receive a second read-enable signal having a different voltage than the single read-enable signal RENB to cause, by itself or in conjunction with the read-enable signal RENB, the product circuit 320B to generate the ternary product signal TOUT on the read bit lines RBL1 and RBL2.

Figures 1, 2, 4A:
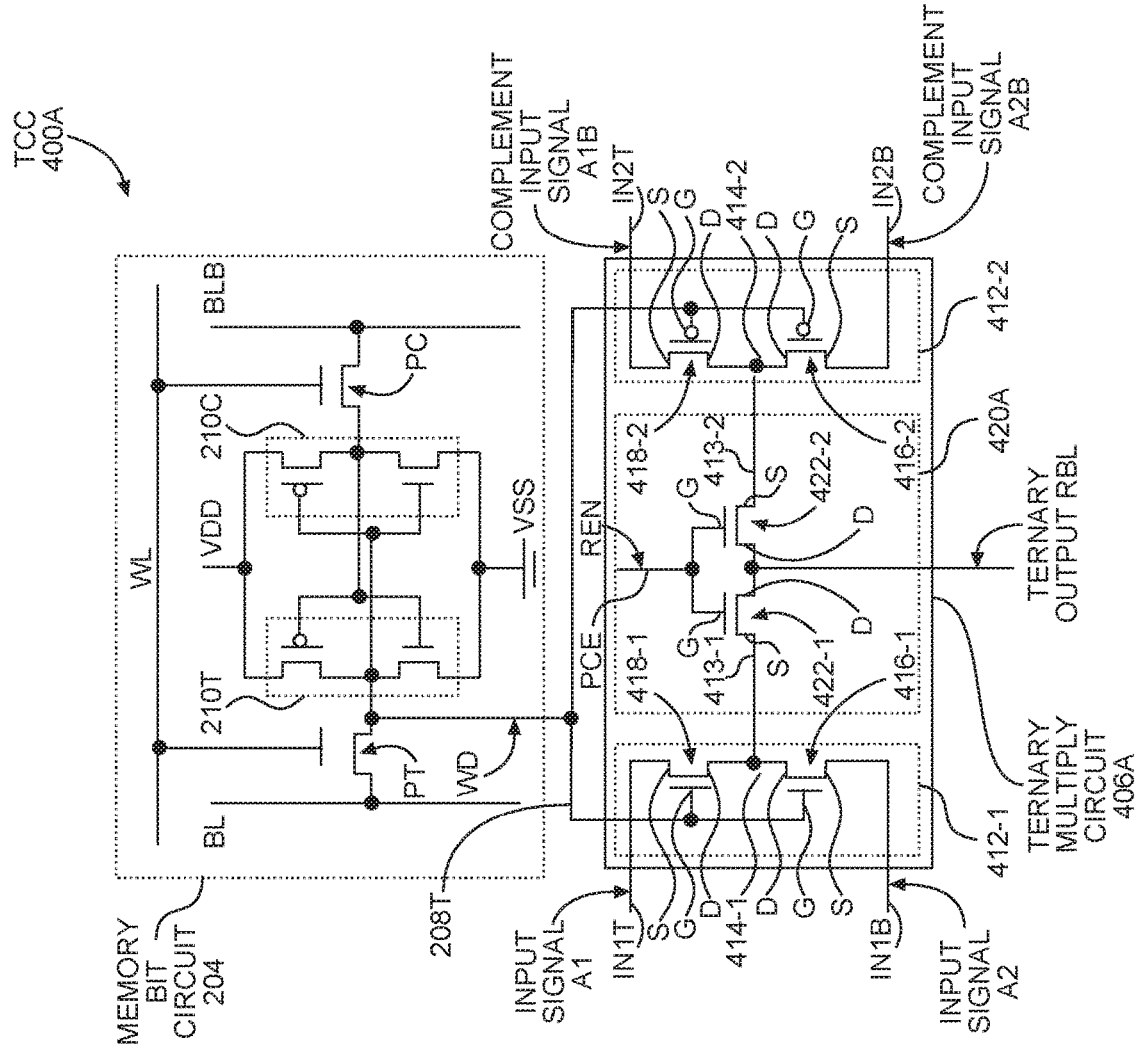

In another example, a TCC 400A is illustrated in FIG. 4A-1, and operation thereof is illustrated in the Table 402A in FIG. 4A-2. Features of the TCC 400A in FIG. 4A-1 corresponding to features in the TCC 200A in FIG. 2A-1 are commonly labeled, and descriptions thereof may not be repeated. The TCC 400A includes a ternary multiply circuit 406A, which includes first and second control circuits 412-1 and 412-2 and a product circuit 420A. The weight data WD may be received over the data line 208T and provided to the first control circuit 412-1 and the second control circuit 412-2. The first control circuit 412-1 includes inputs IN1T and IN1B. In the TCC 400A, the input IN1T receives the input signal A1 and the input IN1B receives the input signal A2. The first control circuit 412-1 is configured to couple both or neither of the input signal A1 and the input signal A2 to a first signal node 414-1 to generate a first product input signal 413-1 based on the weight data WD. Similarly, the second control circuit 412-2 includes inputs IN2T and IN2B. In the TCC 400A, the input IN2T receives the complement input signal A1B and the input IN2B receives the complement input signal A2B. The second control circuit 412-2 is configured to couple both or neither of the complement input signal A1B and the complement input signal A2B to a second signal node 414-2 to generate a second product input signal 413-2 based on the weight data WD.

The first control circuit 412-1 in the ternary multiply circuit 406A includes a first transistor 416-1 serially coupled to a second transistor 418-1 at the first signal node 414-1. The first transistor may 416-1 and the second transistor 418-1 may both be a first type (e.g., N-type) transistor. A gate G of the first transistor 416-1 and a gate G of the second transistor 418-1 may each be coupled to the data line 208T such that the weight data WD controls the first and second transistors 416-1 and 418-1. The second control circuit 412-2 includes a third transistor 416-2 serially coupled to a fourth transistor 418-2 at the second signal node 414-2. The third transistor 416-2 and the fourth transistor 418-2 may both be the second type transistor (e.g., P-type). A gate G of the third transistor 416-2 and a gate G of the fourth transistor 418-2 may be coupled to the data line 208T such that the weight data WD controls the third and fourth transistors 416-2 and 418-2.

The first transistor 416-1 of the first control circuit 412-1 includes a first source/drain region D coupled to the first signal node 414-1 and a second source/drain region S coupled to the input IN1B. The second transistor 418-1 of the first control circuit 412-1 includes a first source/drain region D coupled to the first signal node 414-1 and a second source/drain region S coupled to the input IN1T. The third transistor 416-2 of the second control circuit 412-2 includes a first source/drain region D coupled to the second signal node 414-2 and a second source/drain region S coupled to the input IN2B. The fourth transistor 418-2 of the second control circuit 412-2 includes a first source/drain region D coupled to the second signal node 414-2 and a second source/drain region S coupled to the input IN2T.

The product circuit 420A is coupled to the first signal node 414-1 and the second signal node 414-2 and is configured to generate the ternary product signal TOUT on the ternary output RBL based on both of the first product signal input 413-1 and the second product input signal 413-2 in response to the read-enable signal REN indicating an active state received on the read-enable input PCE. The ternary product signal TOUT is generated on the ternary output RBL in response to the read-enable signal REN indicating the active state by having a higher voltage (e.g., 1 V). In particular, the product circuit 420A includes a first pass-gate transistor 422-1 of the first type (e.g., N-type) and a second pass-gate transistor 422-2 of the first type. A gate G of the first pass-gate transistor 422-1 and a gate G of the second pass-gate transistor 422-2 are coupled to the read-enable input PCE to receive the read-enable signal REN. The first pass-gate transistor 422-1 includes a first source/drain region S coupled to the first signal node 414-1 and a second source/drain region D coupled to the ternary output RBL. The second pass-gate transistor 422-2 includes a first source/drain region S coupled to the second signal node 414-2 and a second source/drain region D coupled to the ternary output RBL. Thus, in the TCC 400A, the second source/drain region D of the first pass-gate transistor 422-1 and the second source/drain region D of the second pass-gate transistor 422-2 are coupled to the ternary output RBL, and the ternary product signal TOUT is an analog signal generated on the ternary output RBL in response to the read-enable signal REN indicating an active state at a higher voltage. Since both of the first and second pass-gate transistors 422-1 and 422-2 are of the first type (e.g., N-type), both of the pass-gate transistors 422-1 and 422-2 are turned on in response to the read-enable signal REN having the higher voltage (e.g., 1 V).

When the read-enable signal REN turns on both of the pass-gate transistors 422-1 and 422-2, the ternary output RBL is coupled to the first signal node 414-1 of the first control circuit 412-1 and to the second signal node 414-2 of the second control circuit 412-2. Thus, a voltage level on the ternary output RBL depends on a voltage level indicating the first product input signal 413-1 on the first signal node 414-1 and the second product input signal 413-2 on the second signal node 414-2. An analog circuit (not illustrated) external to the TCC 400A may be coupled to the ternary output RBL to detect the ternary product signal TOUT by determining a voltage level of the ternary output RBL.

Operation of the TCC 400A of FIG. 4A-1 is illustrated by the Table 402A of FIG. 4A-2. Operation of the ternary multiply circuit 406A in view of the input combination shown in the top row of Table 402A is described with reference to the binary input signals A1, A2 and weight data WD. The input signal A1 having a value of binary "1" is received on input IN1T, the input signal A2 having a value of binary "1" is received on input IN1B, the complement input signal A1B having a value of binary "0" is received on input IN2T, and the complement input signal A2B having a value of binary "0" is received on input IN2B. Weight data WD having a value of binary "1" received at the gate G of the first transistor 416-1 turns on the first transistor 416-1 and at the gate G of the second transistor 418-1 turns on the second transistor 418-1 of the first control circuit 412-1. Since a binary "1" is coupled to the first signal node 414-1 by both of the first transistor 416-1 and the second transistor 418-1, the first signal node 414-1 has a value of binary "1." Weight data WD having a value of binary "1" received at the gate G of the third transistor 416-2 and at the gate G of the fourth transistor 418-2 turns off both of the third transistor 416-2 and the fourth transistor 418-2 of the second control circuit 412-2, so the second signal node 414-2 remains floating, not driven to any voltage. With a binary "1" at the first signal node 414-1 and the second signal node 414-2 floating, a higher voltage analog signal corresponding to the binary "1" (and ternary "+1") is generated on the ternary output RBL in response to the read-enable signal REN being asserted at the higher voltage (e.g., 1 V). Operation of the ternary multiply circuit 406A with other input combinations is understood by a similar analysis.

In this regard, by representing the ternary input value T_IN with binary values and storing the ternary weight data T_WT having a ternary value of "+1" or "−1" in the memory bit circuit 204, a product may be generated by an equivalent XNOR operation of the binary values representing the ternary data under the control of a single read-enable signal REN provided to the TCC 400A in FIG. 4A-1. The TCC 400A does not include a second read-enable input, so the TCC 400A does not receive a second read-enable signal having a different voltage than the single read-enable signal REN to cause, by itself or in conjunction with the read-enable signal REN, the product circuit 420A to generate the ternary product signal TOUT on the ternary output RBL.

Figures 1, 2, 4B:
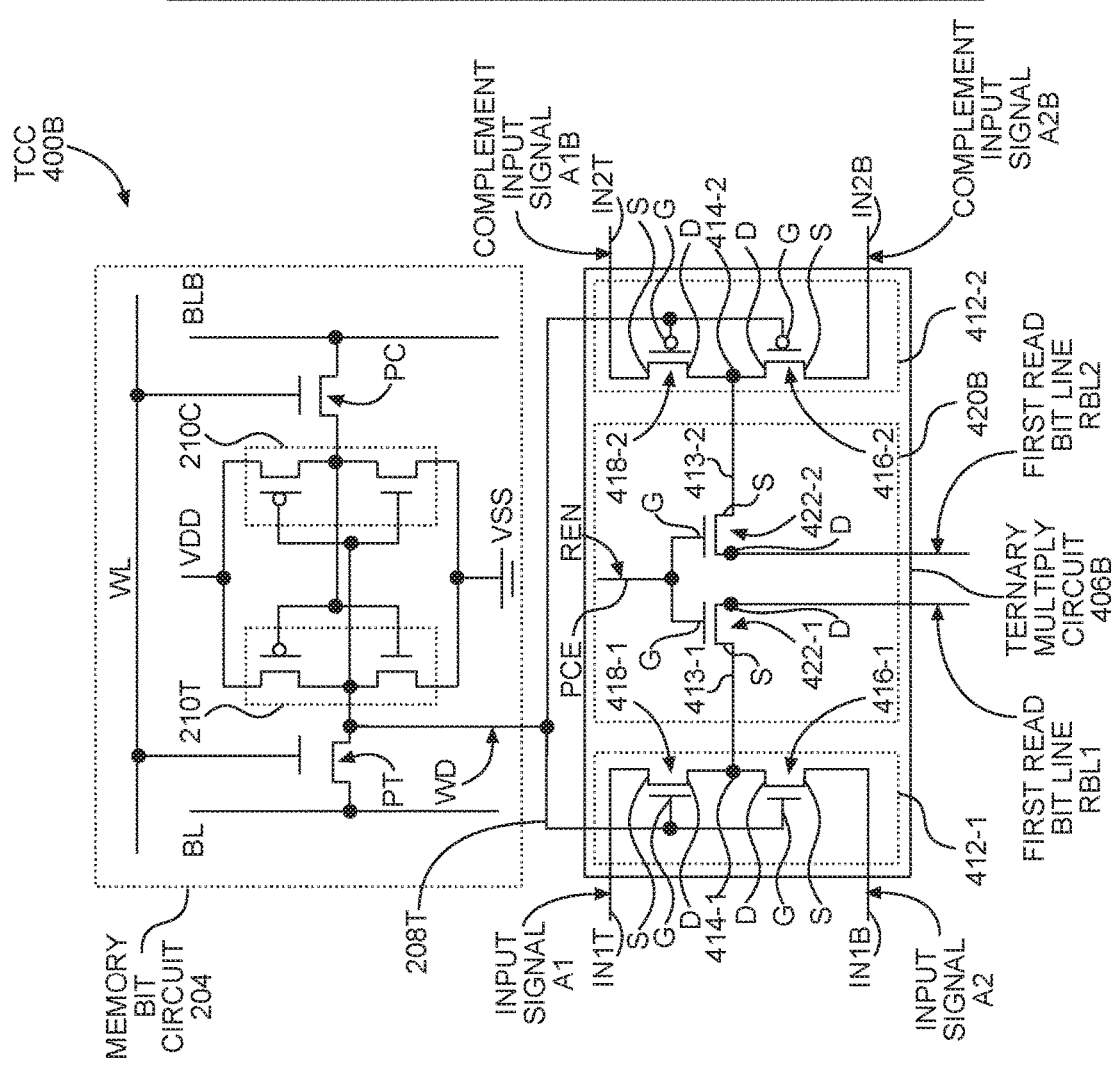

In another example, a TCC 400B is illustrated in FIG. 4B-1, and operation thereof is illustrated in the Table 402B in FIG. 4B-2. Features of the TCC 400B in FIG. 4B-1 corresponding to features in the TCC 400A in FIG. 4A-1 are commonly labeled, and descriptions thereof may not be repeated. The TCC 400B includes a ternary multiply circuit 406B with the first and second control circuits 412-1 and 412-2. In the TCC 400B, operation of the first control circuit 412-1 and the second control circuit 412-2 is the same as in the TCC 400A, and the first and second control circuits 412-1 and 412-2 in the TCC 400B are coupled to the same inputs as in the TCC 400A, so the first and second control circuits 412-1 and 412-2 in TCC 400B provide the same first product input signal 413-1 and second product input signal 413-2 that are generated at the first and second signal nodes 414-1 and 414-2 of the TCC 400A. However, the ternary multiply circuit 406B includes a product circuit 420B coupled to the first signal node 414-1 and the second signal node 414-2. In contrast to generating the ternary product signal TOUT as an analog signal on the ternary output RBL based on both of the first product input signal 413-1 and the second product input signal 413-2, as in the product circuit 420A in the TCC 400A, the product circuit 420B is configured to generate a ternary product signal TOUT as a two-bit binary signal with the first and second product input signals 413-1 and 413-2 provided on the first and second read bit lines RBL1 and RBL2, respectively, in response to the read-enable signal REN received on the read-enable input PCE indicating an active state.

In particular, the product circuit 420B includes the first pass-gate transistor 422-1 of the first type (e.g., N-type) and the second pass-gate transistor 422-2 of the first type. The gate G of the first pass-gate transistor 422-1 and the gate G of the second pass-gate transistor 422-2 may be coupled to the read-enable input PCE to receive the read-enable signal REN. The first pass-gate transistor 422-1 includes a first source/drain region S coupled to the first signal node 414-1, and the second pass-gate transistor 422-2 includes a first source/drain region S coupled to the second signal node 414-2. However, the second source/drain region D of the first pass-gate transistor 422-1 and the second source/drain region D of the second pass-gate transistor 422-2 are not coupled to each other. Instead, in the TCC 400B, the second source/drain region D of the first pass-gate transistor 422-1 is coupled to the first read bit line RBL1, and the second source/drain region D of the second pass-gate transistor 422-2 is coupled to the second read bit line RBL2, such that the ternary product signal TOUT is generated as a two-bit binary signal with the first and second product input signals 413-1 and 413-2 provided on the first and second read bit lines RBL1 and RBL2. Since both of the first and second pass-gate transistors 422-1 and 422-2 are of the first type (e.g., N-type), both of the pass-gate transistors 422-1 and 422-2 are turned on in response to the read-enable signal REN indicating an active state by a higher voltage (e.g., binary "1"). The binary values of the first and second read bit lines RBL1 and RBL2 are shown inside the parentheses in the last column in Table 402B. The two-bit binary values of the first and second read bit lines RBL1 and RBL2 may be translated to ternary values "+1," "−1," and "0" as discussed above.

The TCC 400B does not include a second read-enable input, so the TCC 400B does not receive a second read-enable signal having a different voltage than the single read-enable signal REN to cause, by itself or in conjunction with the read-enable signal REN, the product circuit 420B to generate the ternary product signal TOUT on the read bit lines RBL1 and RBL2.

In another example, a TCC 500A is illustrated in FIG. 5A-1, and operation thereof is illustrated in the Table 502A in FIG. 5A-2. Features of the TCC 500A in FIG. 5A-1 corresponding to features in the TCC 200A in FIG. 2A-1 are commonly labeled, and descriptions thereof may not be repeated. The TCC 500A includes a ternary multiply circuit 506A, which includes first and second control circuits 512-1 and 512-2 and a product circuit 520A. The complement weight data WDB may be received over the complement data line 208C and provided to the first control circuit 512-1 and to the second control circuit 512-2. The first control circuit 512-1 includes inputs IN1T and IN1B. In the TCC 500A, the input IN1T receives the complement input signal A1B and the input IN1B receives the complement input signal A2B. The first control circuit 512-1 is configured to couple both or neither of the complement input signal A1B and the complement input signal A2B to a first signal node 514-1 to generate a first product input signal 513-1 in response to the complement weight data WDB. Similarly, the second control circuit 512-2 includes inputs IN2T and IN2B. In the TCC 500A, the input IN2T receives the input signal A1 and the input IN2B receives the input signal A2. The second control circuit 512-2 is configured to couple both or neither of the input signal A1 and the input signal A2 to a second signal node 514-2 to generate a second product input signal 513-2 in response to the complement weight data WDB.

The first control circuit 512-1 in the ternary multiply circuit 506A includes a first transistor 516-1 serially coupled to a second transistor 518-1 at the first signal node 514-1. The first transistor 516-1 and the second transistor 518-1 may both be a first type (e.g., N-type) transistor. A gate G of the first transistor 516-1 and a gate G of the second transistor 518-1 may each be coupled to the complement data line 208C such that the complement weight data WDB controls the first and second transistors 516-1 and 518-1. The second control circuit 512-2 includes a third transistor 516-2 serially coupled to a fourth transistor 518-2 at the second signal node 514-2. The third transistor 516-2 and the fourth transistor 518-2 may both be the second type transistor (e.g., P-type). A gate G of the third transistor 516-2 and a gate G of the fourth transistor 518-2 may also be coupled to the complement data line 208C such that the complement weight data WDB controls the third and fourth transistors 516-2 and 518-2.

The first transistor 516-1 of the first control circuit 512-1 includes a first source/drain region D coupled to the first signal node 514-1 and a second source/drain region S coupled to the input IN1B. The second transistor 518-1 of the first control circuit 512-1 includes a first source/drain region D coupled to the first signal node 514-1 and a second source/drain region S coupled to the input IN1T. The third transistor 516-2 of the second control circuit 512-2 includes a first source/drain region D coupled to the second signal node 514-2 and a second source/drain region S coupled to the input IN2B. The fourth transistor 518-2 of the second control circuit 512-2 includes a first source/drain region D coupled to the second signal node 514-2 and a second source/drain region S coupled to the input IN2T.

The product circuit 520A is coupled to the first signal node 514-1 and the second signal node 514-2 and is configured to generate the ternary product signal TOUT on the ternary output RBL based on both of the first product input signal 513-1 and the second product input signal 513-2 in response to the read-enable signal REN indicating an active state received on the read-enable input PCE. The ternary product signal TOUT is generated on the ternary output RBL in response to the read-enable signal REN indicating an active state by having a higher voltage (e.g., 1 V). In particular, the product circuit 520A includes a first pass-gate transistor 522-1 of the first type (e.g., N-type) and a second pass-gate transistor 522-2 of the first type. A gate G of the first pass-gate transistor 522-1 and a gate G of the second pass-gate transistor 522-2 may be coupled to the read-enable input PCE to receive the read-enable signal REN. The first pass-gate transistor 522-1 includes a first source/drain region S coupled to the first signal node 514-1 and a second source/drain region D coupled to the ternary output RBL. The second pass-gate transistor 522-2 includes a first source/drain region S coupled to the second signal node 514-2 and a second source/drain region D coupled to the ternary output RBL. Thus, in the TCC 500A, the second source/drain region D of the first pass-gate transistor 522-1 is coupled to the second source/drain region D of the second pass-gate transistor 522-2, and the ternary product signal TOUT is an analog signal generated on the ternary output RBL in response to the read-enable signal REN asserted at a higher voltage. Since both of the first and second pass-gate transistors 522-1 and 522-2 are of the first type (e.g., N-type), both of the pass-gate transistors 522-1 and 522-2 are turned on in response to the read-enable signal REN having the higher voltage (e.g., 1 V).

When the read-enable signal REN turns on both of the pass-gate transistors 522-1 and 522-2, the ternary output RBL is coupled to the first signal node 514-1 of the first control circuit 512-1 and to the second signal node 514-2 of the second control circuit 512-2. Thus, a voltage level on the ternary output RBL depends on a voltage level indicating the first product input signal 513-1 on the first signal node 514-1 and the second product input signal 513-2 on the second signal node 514-2. An analog circuit (not illustrated) external to the TCC 500A may be coupled to the ternary output RBL to detect the ternary product signal TOUT by determining a voltage level of the ternary output RBL.

Operation of the TCC 500A of FIG. 5A-1 is illustrated by the Table 502A of FIG. 5A-2. Operation of the ternary multiply circuit 506A in view of the input combination shown in the top row of Table 502A is described with reference to the binary input signals A1, A2 and complement weight data WDB. The complement input signal A1B having a value of binary "0" is received on input IN1T, the complement input signal A2B having a value of binary "0" is received on input IN B, the input signal A1 having a value of binary "1" is received on input IN2T, and the input signal A2 having a value of binary "1" is received on input IN2B. The complement weight data WDB having a value of binary "0" received at the gate G of the first transistor 516-1 and the gate G of the second transistor 518-1 turns off both of the first transistor 516-1 and the second transistor 518-1 of the first control circuit 512-1, so the first signal node 514-1 remains floating, not driven to any voltage. The complement weight data WDB having a value of binary "0" received at the gate G of the third transistor 516-2 and the gate G of the fourth transistor 518-2 turns on both of the third transistor 516-2 and the fourth transistor 518-2 of the second control circuit 512-2. Since a binary "1" is coupled to the second signal node 514-2 by both of the third transistor 516-2 and the fourth transistor 518-2, the second signal node 514-2 has a value of binary "1." With a binary "1" at the second signal node 514-2 and the first signal node 514-1 floating, a higher voltage analog signal corresponding to the binary "1" (and ternary "+1") is generated on the ternary output RBL in response to the read-enable signal REN being asserted at the higher voltage (e.g., 1 V). Operation of the ternary multiply circuit 506A with other input combinations is understood by a similar analysis.

In this regard, by representing the ternary input value T_IN with binary values and storing the ternary weight data T_WT having a ternary value of "+1" or "−1 in the memory bit circuit 204, a product may be generated by an equivalent XNOR operation of the binary values representing the ternary data under the control of a single read-enable signal REN provided to the TCC 500A in FIG. 5A-1.

The TCC 500A does not include a second read-enable input, so the TCC 500A does not receive a second read-enable signal having a different voltage than the single read-enable signal REN to cause, by itself or in conjunction with the read-enable signal REN, the product circuit 520A to generate the ternary product signal TOUT on the ternary output RBL.

Figures 1, 2, 5B:
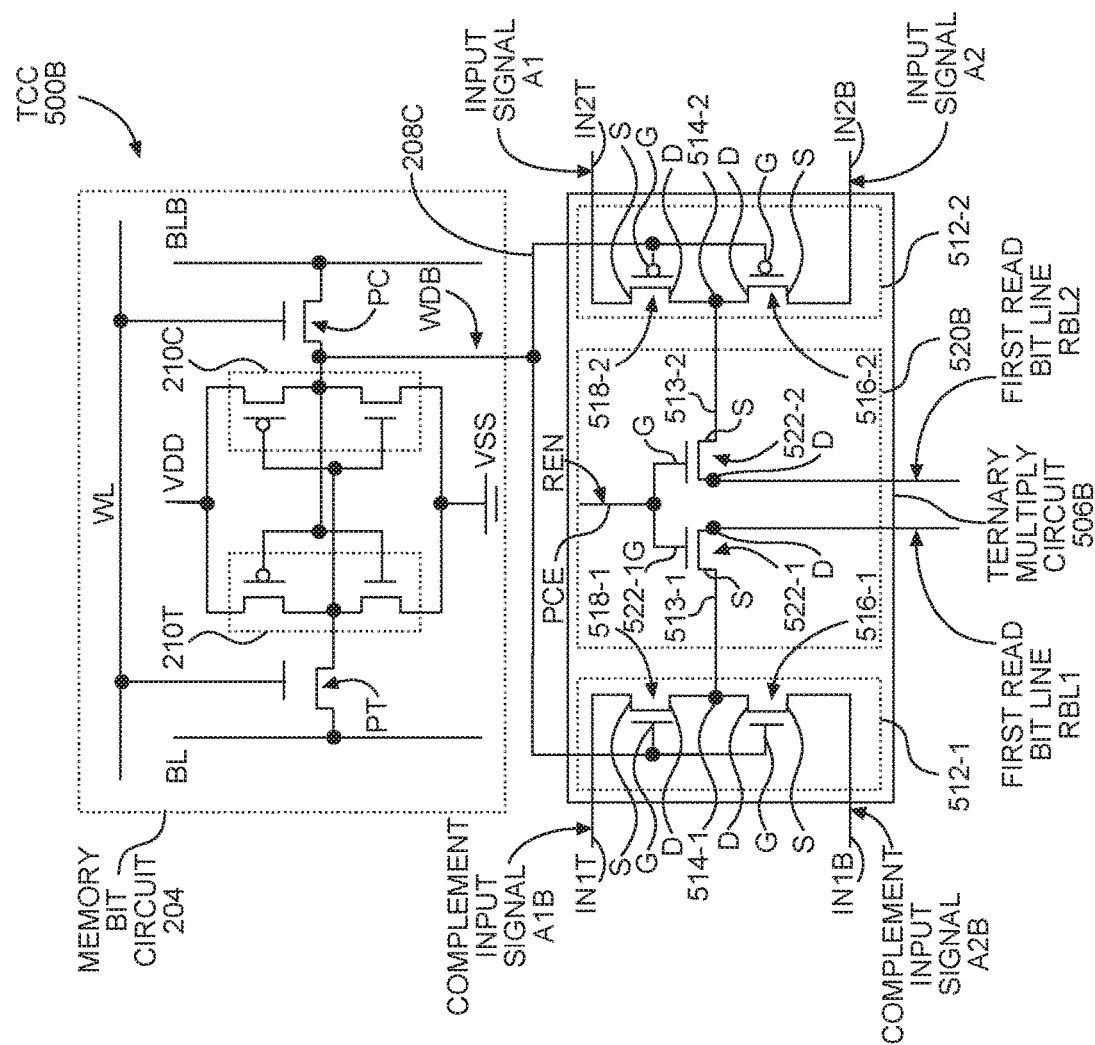

In another example, a TCC 500B is illustrated in FIG. 5B-1, and operation thereof is illustrated in the Table 502B in FIG. 5B-2. Features of the TCC 500B in FIG. 5B-1 corresponding to features in the TCC 500A in FIG. 5A-1 are commonly labeled, and descriptions thereof may not be repeated. The TCC 500B includes a ternary multiply circuit 506B with the first and second control circuits 512-1 and 512-2. In the TCC 500B, operation of the first control circuit 512-1 and the second control circuit 512-2 is the same as in the TCC 500A, and the first and second control circuits 512-1 and 512-2 in the TCC 500B are coupled to the same inputs as in the TCC 500A, so the first and second control circuits 512-1 and 512-2 of the TCC 500B provide the same first product input signal 513-1 and second product input signal 513-2 that are generated at the first and second signal nodes 514-1 and 514-2 of the TCC 500A. However, the ternary multiply circuit 506B includes a product circuit 520B coupled to the first signal node 514-1 and the second signal node 514-2. In contrast to generating the ternary product signal TOUT as an analog signal on the ternary output RBL based on both of the first product input signal 513-1 and the second product input signal 513-2, as in the product circuit 520A in the TCC 500A, the product circuit 520B is configured to generate a ternary product signal TOUT as a two-bit binary signal with the first and second product input signals 513-1 and 513-2 provided on the first and second read bit lines RBL1 and RBL2, respectively, in response to the read-enable signal REN received on the read-enable input PCE indicating an active state.

In particular, the product circuit 520B includes the first pass-gate transistor 522-1 of the first type (e.g., N-type) and the second pass-gate transistor 522-2 of the first type. The gate G of the first pass-gate transistor 522-1 and the gate G of the second pass-gate transistor 522-2 may be coupled to the read-enable input PCE to receive the read-enable signal REN. The first pass-gate transistor 522-1 includes a first source/drain region S coupled to the first signal node 514-1, and the second pass-gate transistor 522-2 includes a first source/drain region S coupled to the second signal node 514-2. However, the second source/drain region D of the first pass-gate transistor 522-1 and the second source/drain region D of the second pass-gate transistor 522-2 are not coupled to each other at the ternary output RBL. Instead, in the TCC 500B, the second source/drain region D of the first pass-gate transistor 522-1 is coupled to the first read bit line RBL1, and the second source/drain region D of the second pass-gate transistor 522-2 is coupled to the second read bit line RBL2, such that the ternary product signal TOUT is generated as a two-bit binary signal with the first and second product input signals 513-1 and 513-2 provided on the first and second read bit lines RBL1 and RBL2. Since both of the first and second pass-gate transistors 522-1 and 522-2 are of the first type (e.g., N-type), both of the pass-gate transistors 522-1 and 522-2 are turned on in response to the read-enable signal REN indicating an active state by a higher voltage (e.g., 1 V). The binary values of the first and second read bit lines RBL1 and RBL2 are shown inside the parentheses in the last column in Table 502B. The two-bit binary values of the first and second read bit lines RBL1 and RBL2 may be translated to ternary values "+1," "−1," and "0" as discussed above. The TCC 500B does not include a second read-enable input, so the TCC 500B does not receive a second read-enable signal having a different voltage than the single read-enable signal REN to cause, by itself or in conjunction with the read-enable signal REN, the product circuit 520B to generate the ternary product signal TOUT on the read bit lines RBL1 and RBL2.

Figure 6A:
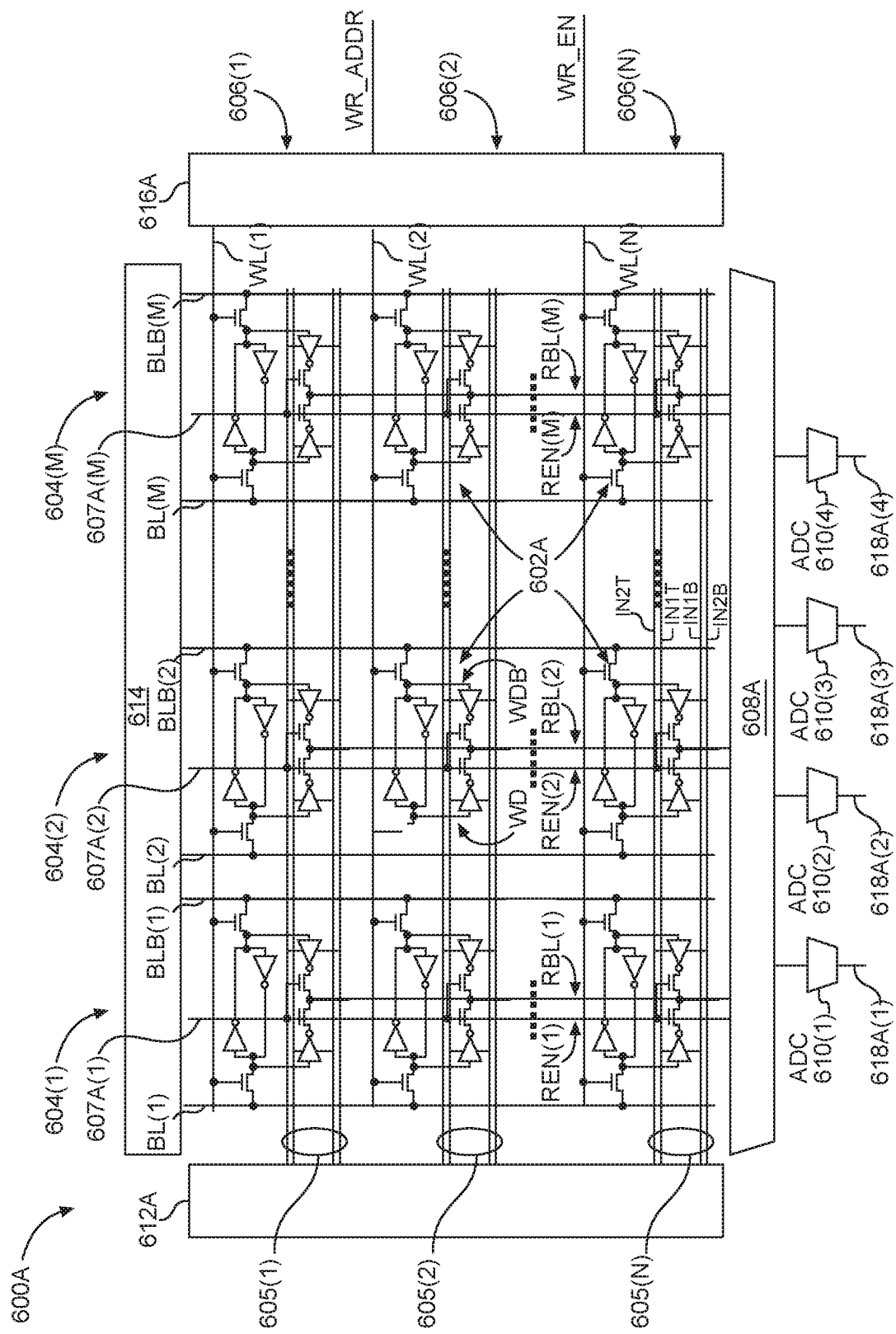
FIG. 6A is a schematic view of an array of TCCs, as shown in any of FIGS. 2A-1, 3A-1, 4A-1 and 5A-1, including a ternary input driver, a weight write controller, and a column controller circuit to generate an analog signal accumulating the ternary products generated in each of the TCCs in a column in response to a single column read-enable signal indicating an active state.
Figure 6B:
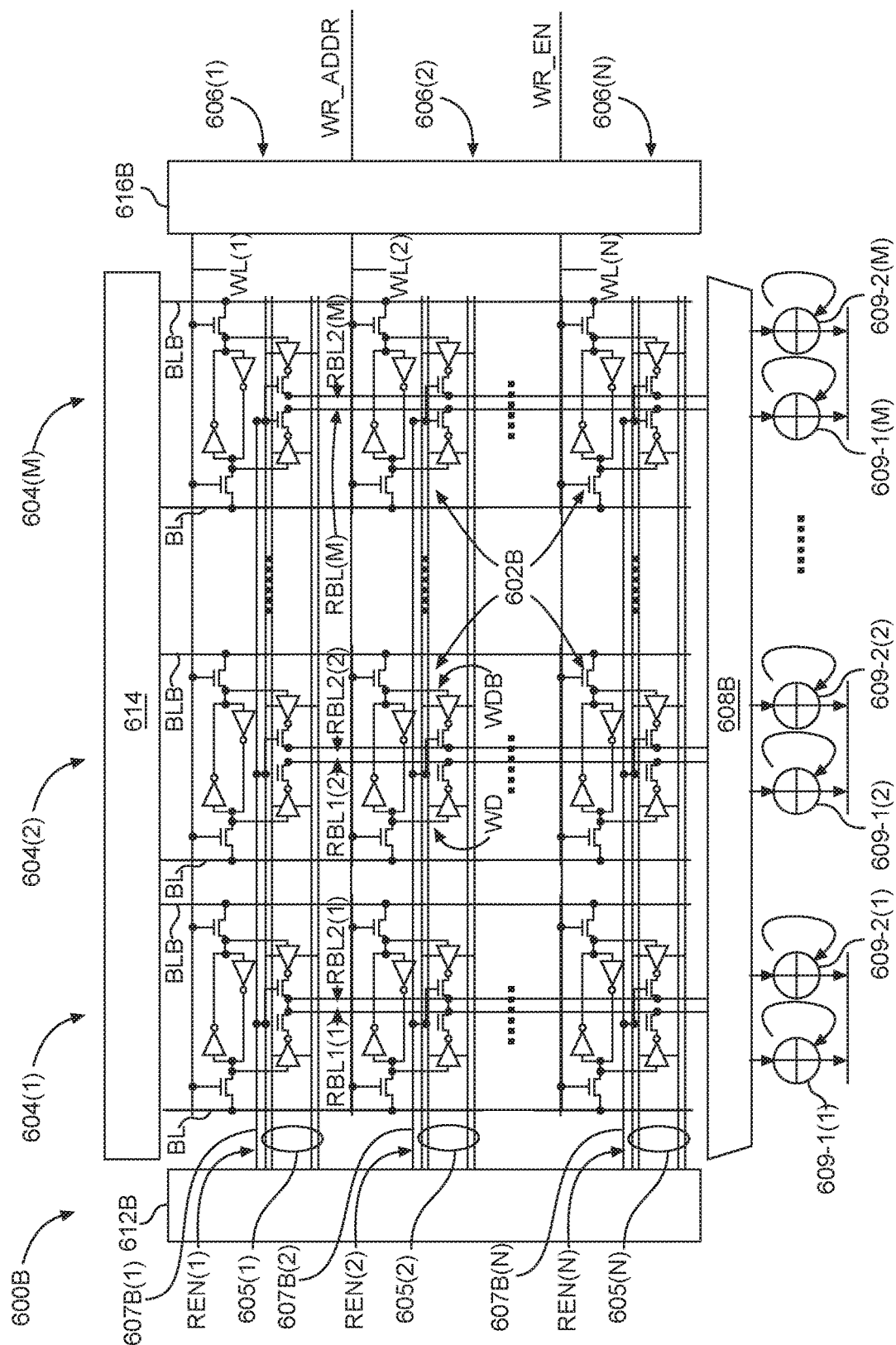
FIG. 6B is a schematic view of an array of TCCs, as shown in any of FIGS. 2B-1, 3B-1, 4B-1 and 5B-1, including a ternary input driver, a weight write controller, a row controller, and an adder circuit to generate a binary accumulation of the ternary products generated in each of the TCCs in a column by employing a sequence of row operations in response to respective single read-enable signals indicating an active state.

FIGS. 6A and 6B are schematic diagrams of in-memory ternary computation arrays 600A and 600B of TCCs in which each TCC generates the ternary product signal TOUT in analog or binary form, respectively. FIG. 6A is a schematic diagram of an array 600A of TCC elements 602A that may be any of the TCC 200A of FIG. 2A-1, the TCC 300A of FIG. 3A-1, the TCC 400A of FIG. 4A-1, or the TCC 500A of FIG. 5A-1 discussed above, each of which generates an analog ternary product signal TOUT on the ternary output RBL.

The array 600A may include, for example, rows 606(1)-606(N) and columns 604(1)-604(M) of TCC elements 602A. For example, the array 600A may include N=128, 256, 512 or another number of rows, and may include 128, 256, 512, 1024, 2048, or another number of columns. The array 600A includes N pairs of row ternary input lines 605(1)-605(N), with each pair 605(y) (y=1 to N) associated with a respective one of the N rows and coupled to M TCC elements 602A along the respective one of the N rows 606(1)-606(N).

Each of the N TCC elements 602A in a column 604(x) (x=1 to M) is coupled to a column ternary output RBL(x) on which the analog ternary product signals TOUT(x) of all the TCC elements 602A in the column 604(x) are accumulated.

The array 600A includes a column controller 608A that drives a column read-enable signal REN(x) (or RENB(x)) on column read-enable lines 607A(1)-607A(M), which are coupled to each of the N TCC elements 602A in the columns 604(1)-604(M). In this manner, the column controller 608A sets the column read-enable signal REN(x) in each of the N TCC elements 602A to indicate an active state. The column controller 608A receives the column ternary output RBL(x) and accumulates the analog ternary product signals TOUT from TCC(0,x)-TCC(N,x) on RBL(x) to generate an accumulated column output. The column controller 608A couples the M column ternary outputs RBL(x) to analog-to-digital converters (ADCs) 610(1)-610(4) to convert the accumulated analog ternary product signals TOUT to two-bit digital values 618A(1)-618A(4) that are provided as inputs to a next stage in a neural network. By employing a single column read-enable line 607(x) to carry a single read-enable signal REN(x) (or RENB(x)) for enabling read operations of each column 604(1)-604(M), wiring complexity and congestion in a metal layer of interconnects of the array 600A are reduced.

As shown in FIG. 6A, the array 600A includes a row ternary input driver 612A that drive sets of input lines 605(1)-605(N) to the N rows 606(1)-606(N). As shown in row 606(N), the input lines 605(N) include the inputs IN1T, IN1B, IN2T, and IN2B shared by each of the M TCC elements 602A in the row 606(N). The input signals A1, A2, A1B, and A2B are arranged on the input lines 605(y) in accordance with the particular example of TCC element 602A in one of FIGS. 2A-1, 3A-1, 4A-1 and 5A-1 employed in the array 600A. A ternary multiplication using the input signals A1, A2, A1B, and A2B provided on the input lines 605(y) is performed in a TCC element 602A of a column 604(x) in which the read-enable signal REN (or RENB) is activated.

The array 600A includes a weight write bit line driver 614 coupled to bit lines BL(1)-BL(M) and complement bit lines BLB(1)-BLB(M) for columns 604(1)-604(M). The weight write bit line driver 614 is configured to provide the weight data WD and the complement weight data WDB on the bit lines BL(1)-BL(M) and the complement bit lines BLB(1)-BLB(M), respectively, for storage into the TCC elements 602A. The weight write bit line driver 614 provides unique write weight data WD and complement weight data WDB to each of the columns 604(1)-604(M) in the array 600A over the bit lines BL(1)-BL(M) and the complement bit lines BLB(1)-BLB(M). The bit lines BL(1)-BL(M) and the complement bit lines BLB(1)-BLB(M) are coupled to all the N TCC elements 602A of their respective columns 604(1)-604(M). For example, the bit line BL(1) and the complement bit line BLB(1) are each coupled to every TCC element 602A(1,1)-602A(N,1) in column 604(1). The array 600A also includes a word line driver 616A to provide word lines WL(1)-WL(N) to the respective rows 606(1)-606(N) such that by activating one of the word lines WL(1)-WL(N), the weight data WD for each of the M columns in one of the rows 606(1)-606(N) may be stored in the TCC elements 602A. The word lines WL(1)-WL(N) may be individually controlled by the word line driver 616A based on decoding a write address signal WR_ADDR and receiving a write-enable signal WR_EN.

FIG. 6B is a schematic diagram of an array 600B of TCC elements 602B that may be any of the TCC 200B of FIG. 2B-1, the TCC 300B of FIG. 3B-1, the TCC 400B of FIG. 4B-1, or the TCC 500B of FIG. 5B-1 discussed above, each of which generates a ternary product signal TOUT in two-bit binary form on the first and second read bit lines RBL1, RBL2. The array 600B may include, for example, columns 604(1)-604(M) and rows 606(1)-606(N) of TCC elements 602B. For example, the array 600B may include N=128, 256, 512 or another number of rows, and may include M=128, 256, 512, 1024, 2048, or another number of columns. Thus, the first and second read bit lines RBL1, RBL2 of each of the TCC elements 602B in a column 604(x) are coupled to first and second column read bit lines RBL1(x), RBL2(x). Since digital data cannot be accumulated on the first and second column read bit lines RBL1(x), RBL2(x) in a manner similar to the analog signals accumulated on the column ternary output RBL in array 600A, the TCC elements 602B in a column 604(x) are individually enabled. In this regard, the first and second read bit lines RBL1, RBL2 of the TCC elements 602B in a column 604(x) are generated one at a time and collected by a column controller 608B. The column controller 608B collects the first and second column read bit lines RBL1(1)-RBL1(M), and RBL2(1)-RBL2(M) while reading the TCC elements 602B one row at a time. Each row must be enabled individually for reading, and the first and second column read bit lines RBL1(x), RBL2(x) are digitally summed by adders 609-1(x) and 609-2(x). Adders 609-1(x) and 609-2(x) generate M sums, one for each of the M columns, by adding the ternary product signals TOUT on the column read bit lines RBL1(x), RBL2(x) in a respective column resulting from sequentially activating row read-enable signals REN in successive rows of the N×M array 600B. In this regard, the column controller 608B differs from the column controller 608A, which provides a single common read-enable line 607(x) common to all TCC elements 602A in a column(x). In the array 600B, row read-enable lines 607B(1)-607B(N) carry the read-enable signals REN(1)-REN(N) to rows 606(1)-606(N). For example, a row ternary input driver 612B may drive the column read-enable signals REN(1)-REN(N) (or RENB(1)-RENB(N)) on the row read-enable lines 607B(1)-607B(N) in respective ones of the N rows in an active state in a row-by-row manner. The column controller 608B is configured to generate M sums, one for each of the M columns 604(1)-604(M), each sum generated by adding the ternary product signals TOUT on the first and second column read bit lines RBL1(x), RBL2(x) in response to the read-enable signals REN(1)-REN(N) n activated sequentially in respective rows of the N×M array. By employing a single read-enable signal REN (or RENB) in each row, wiring complexity and congestion in a metal layer of interconnects of the array 600B are reduced.

As noted, the column controller 608B may receive first and second column read bit lines RBL1(1), RBL2(1) through RBL1(M), RBL2(M) in parallel. The column controller 608B may sequentially collect and accumulate the first and second column read bit lines RBL1(1), RBL2(1) through RBL1(M), RBL2(M) row-by-row (e.g., for all N rows) to generate a sum as a MAC output for each column 604(1)-604(N). As in FIG. 6A, the array 600B of FIG. 6B includes the row ternary input driver 612B that drives sets of input lines 605(1)-605(N) for each row 606(1)-606(N). The array 600B includes a weight write bit line driver 614 coupled to the bit line BL and the complement bit line BLB for each column 604(1)-604(M). The weight write bit line driver 614 is configured to provide the weight data WD and complement weight data WDB on bit line BL and complement bit line BLB, respectively, for storage into the TCC elements 602B. The array 600B also includes the word line driver 616B to provide word lines WL(1)-WL(N) to the respective rows 606(1)-606(N). The word lines WL(1)-WL(N) may be individually controlled by the word line driver 616B based on decoding a write address signal WR_ADDR and receiving a write-enable signal WR_EN.

FIGS. 7A and 7B are block diagrams 700A and 700B of arrays of TCC elements, such as the arrays 600A and 600B in FIGS. 6A and 6B and the associated circuits, including the column controllers 608A and 608B, row ternary input drivers 612A and 612B, weight write bit line driver 614, and word line drivers 616A and 616B. The block diagram 700A includes a MAC output register 702A that receives the outputs of the ADCs 610 of array 600A and stores two-bit MAC results that may be provided as the binary inputs A1, A2 to a next layer in a DNN. The block diagram 700B includes a MAC output register 702B that receives the summed outputs of the adders 609-1(1)-609-1(M), 609-2(1)-609-2(M) and stores two-bit MAC results that may be provided as the binary inputs A1, A2 to a next layer in a DNN.

The TCC array 600A as illustrated in FIG. 6A, comprising any of the TCCs 200A, 300A, 400A, and 500A of FIGS. 2A-1, 3A-1, 4A-1, and 5A-1, respectively, or the TCC array 600B as illustrated in FIG. 6B, comprising any of TCCs 200B, 300B, 400B, and 500B of FIGS. 2B-1, 3B-1,4B-1, and 5B-1, respectively, in which ternary product signals may be generated by row or column in response to a single read-enable signal REN for a ternary MAC operation in a neural network, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
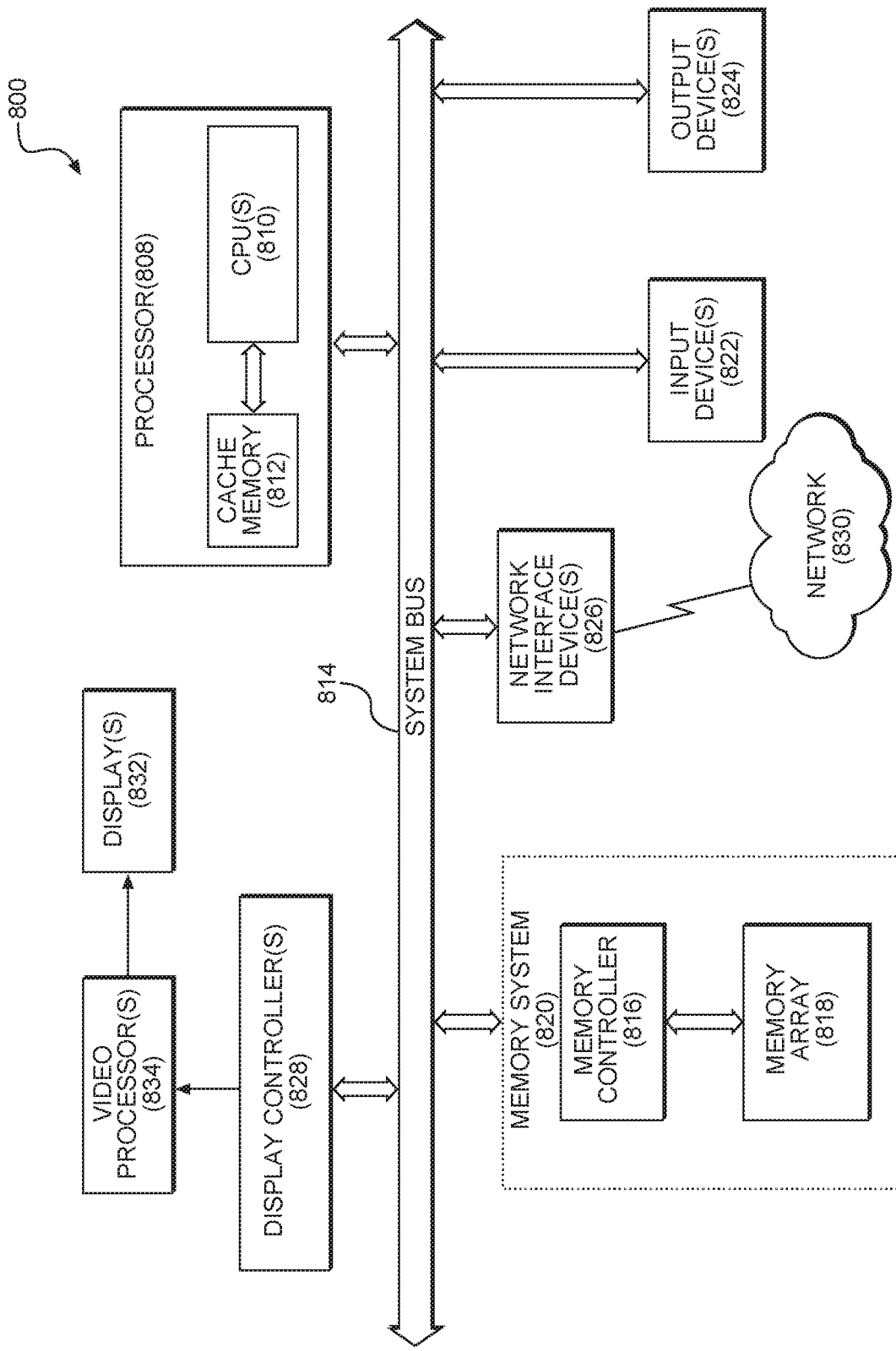
FIG. 8 is a block diagram of an exemplary processor-based system that can include an IC having an array of TCC elements each integrating a memory circuit and a logic circuit to multiply ternary values of a neural network in binary form, the array configured to perform row or column operations in response to a single read-enable signal, such as the arrays in FIGS. 6A and 6B.

In this regard, FIG. 8 illustrates an example of a processor-based system 800 that can include integrated circuits (ICs) having an array of TCC elements with each TCC element integrating a memory circuit and a logic circuit to multiply ternary values of a neural network in binary form, and the array configured to perform row or column operations in response to a single read-enable signal, such as the arrays 600A or 600B in FIGS. 6A and 6B. The processor-based system 800 includes a processor 808 that includes one or more central processor units (CPUs) 810, which may also be referred to as CPU or processor cores. The processor 808 may have cache memory 812 coupled to the CPU(s) 810 for rapid access to temporarily stored data. As an example, the CPU(s) 810 could include an array of TCC elements with each TCC element integrating a memory circuit and a logic circuit to multiply ternary values of a neural network in binary form, and the array configured to perform row or column operations in response to a single read-enable signal, such as the arrays 600A or 600B in FIGS. 6A and 6B. The processor 808 is coupled to a system bus 814 and can intercouple master and slave devices included in the processor-based system 800. As is well known, the processor 808 communicates with these other devices by exchanging address, control, and data information over the system bus 814. For example, the processor 808 can communicate bus transaction requests to a memory controller 816 as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 820 that includes the memory controller 816 and a memory array(s) 818, one or more input devices 822, one or more output devices 824, one or more network interface devices 826, and one or more display controllers 828, as examples. Each of the memory system 820, the one or more input devices 822, the one or more output devices 824, the one or more network interface devices 826, and the one or more display controllers 828 can include the TCC array 600A as illustrated in FIG. 6A, comprising any of the TCCs 200A, 300A, 400A, and 500A of FIGS. 2A-1, 3A-1, 4A-1, and 5A-1, respectively, or the TCC array 600B as illustrated in FIG. 6B, comprising any of the TCCs 200B, 300B, 400B, and 500B of FIGS. 2B-1, 3B-1,4B-1, and 5B-1, respectively, in which ternary product signals may be generated in response to a single read-enable signal REN for a ternary MAC operation in a neural network, and according to any aspects disclosed herein. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The processor 808 may also be configured to access the display controller(s) 828 over the system bus 814 to control information sent to one or more displays 832. The display controller(s) 828 sends information to the display(s) 832 to be displayed via one or more video processors 834, which process the information to be displayed into a format suitable for the display(s) 832. The display(s) 832 can include any type of display, including, but not limited to, a cathode ray tube (CRT), a liquid crystal display (LCD), a plasma display, a light emitting diode (LED) display, etc. The display controller(s) 828, display(s) 832, and/or the video processor(s) 834 can include the TCC array 600A as illustrated in FIG. 6A, comprising any of the TCCs 200A, 300A, 400A, and 500A of FIGS. 2A-1, 3A-1,4A-1, and 5A-1, respectively, or the TCC array 600B as illustrated in FIG. 6B, comprising any of the TCCs 200B, 300B, 400B, and 500B of FIGS. 2B-1, 3B-1,4B-1, and 5B-1, respectively, in which ternary product signals may be generated in response to a single read-enable signal REN for a ternary MAC operation in a neural network, and according to any aspects disclosed herein.

Figure 9:
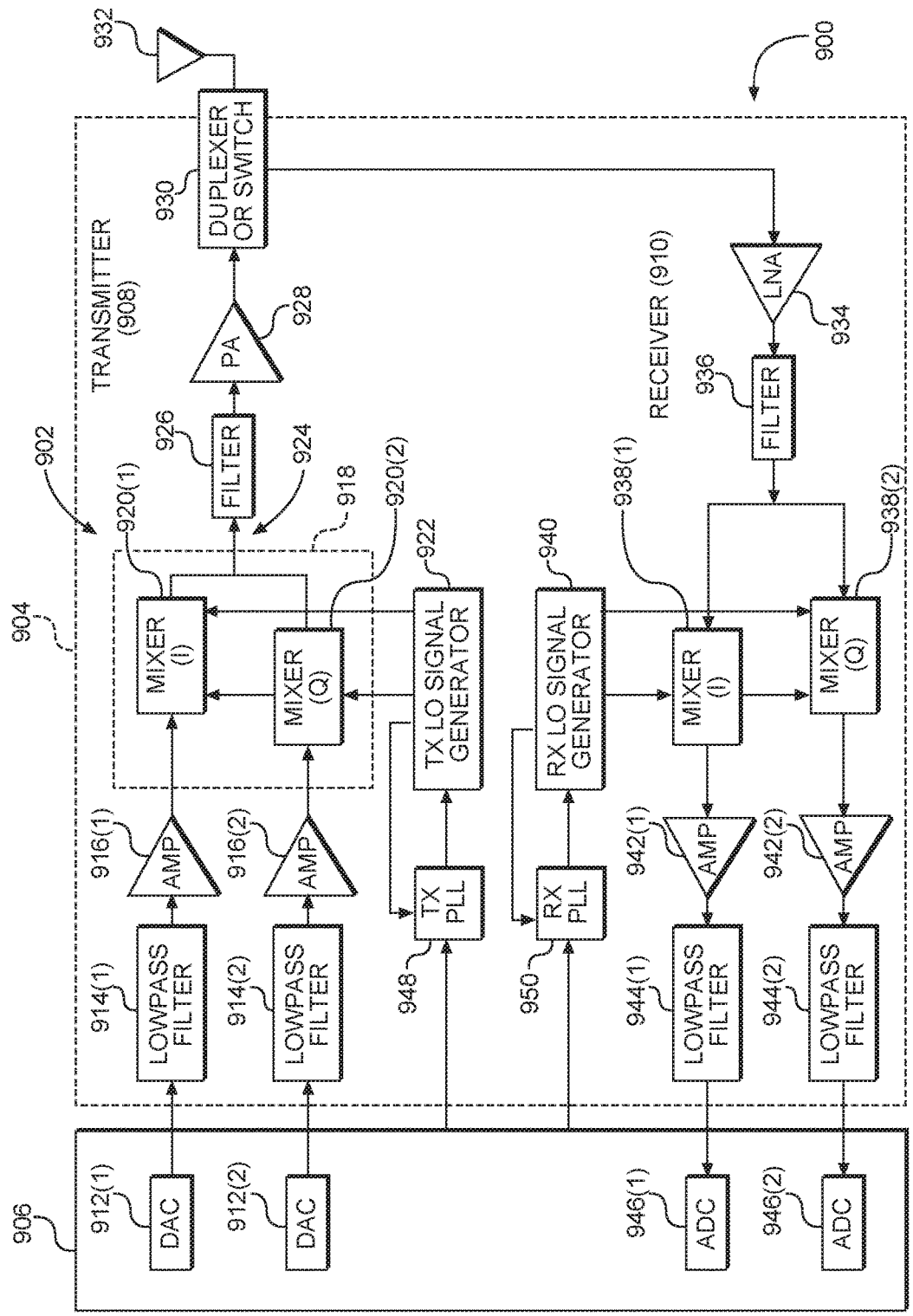
FIG. 9 is a block diagram of an exemplary wireless communications device that includes radio frequency (RF) components formed from an IC, wherein any of the components therein can include an array of TCC elements each integrating a memory circuit and a logic circuit to multiply ternary values of a neural network in binary form, the array configured to perform row or column operations in response to a single read-enable signal, such as the arrays in FIGS. 6A and 6B.

FIG. 9 illustrates an exemplary wireless communications device 900 that includes radio frequency (RF) components formed from an IC 902, wherein any of the components therein can include the TCC array 600A as illustrated in FIG. 6A, comprising any of the TCCs 200A, 300A, 400A, and 500A of FIGS. 2A-1, 3A-1,4A-1, and 5A-1, respectively, or the TCC array 600B as illustrated in FIG. 6B, comprising any of the TCCs 200B, 300B, 400B, and 500B of FIGS.

2B-1, 3B-1,4B-1, and 5B-1, respectively, in which ternary product signals may be generated in response to a single read-enable signal REN for a ternary MAC operation in a neural network, and according to any aspects disclosed herein. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmitted RF signal. The transmitted RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes ADCs 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the LX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. A ternary computation circuit (TCC), comprising:
   a read-enable input configured to receive a read-enable signal;
   a plurality of inputs configured to receive a plurality of input signals indicating a ternary input value;
   a ternary output;
   a memory bit cell circuit configured to store a weight data and a complement weight data complementary to the weight data; and
   a ternary multiply circuit configured to multiply the ternary input value and the weight data in response to the read-enable signal indicating an active state, the ternary multiply circuit comprising:
      a first control circuit configured to couple at least one of a first input signal and a second input signal among the plurality of input signals to a first signal node to generate a first product input signal based on the weight data;
      a second control circuit configured to couple at least one of a third input signal and a fourth input signal among the plurality of input signals to a second signal node to generate a second product input signal based on the weight data; and
      a product circuit configured to couple the first signal node to the ternary output in response to the read-enable signal and couple the second signal node to the ternary output in response to the read-enable signal to generate a ternary product signal on the ternary output based on the first product input signal and the second product input signal;
   wherein the product circuit comprises:
      a first pass-gate transistor of a first type coupled to the first signal node;
      a second pass-gate transistor of the first type coupled to the second signal node; and
      a gate of the first pass-gate transistor and a gate of the second pass-gate transistor coupled to each other and configured to receive the read-enable signal.

2. The TCC of claim 1, wherein:
the product circuit is configured to generate the ternary product signal in response to a first voltage on the read-enable input indicating the read-enable signal is in the active state.

3. The TCC of claim 1, wherein:
the TCC does not comprise a second read-enable input configured to receive a second read-enable signal comprising a voltage different than a voltage of the read-enable signal to cause the product circuit to generate the ternary product signal on the ternary output.

4. The TCC of claim 1, wherein:
the first control circuit is configured to couple the first input signal and the second input signal among the plurality of input signals to the first signal node; and
the second control circuit is configured to couple the third input signal and the fourth input signal among the plurality of input signals to the second signal node.

5. The TCC of claim 4, wherein:
the first control circuit comprises a first transistor of either an N-type or a P-type serially coupled to a second transistor of a same type as the first transistor at the first signal node; and
the second control circuit comprises a third transistor of either the N-type or the P-type serially coupled to a fourth transistor of a same type as the third transistor at the second signal node.

6. The TCC of claim 1, wherein:
the first control circuit is configured to couple only one of the first input signal and the second input signal among the plurality of input signals to the first signal node; and
the second control circuit is configured to couple only one of the third input signal and the fourth input signal among the plurality of input signals to the second signal node.

7. The TCC of claim 6, wherein:
the first control circuit comprises a first transistor of either an N-type or a P-type serially coupled to a second transistor of a type opposite to the first transistor at the first signal node; and
the second control circuit comprises a third transistor of either the N-type or the P-type serially coupled to a fourth transistor of a type opposite to the third transistor at the second signal node.

8. The TCC of claim 1, further comprising:
a data line of the memory bit cell circuit on which the weight data is carried to the first control circuit; and
a complement data line of the memory bit cell circuit on which the complement weight data is carried to the second control circuit.

9. The TCC of claim 8, wherein:
the first control circuit comprises a first transistor serially coupled to a second transistor at the first signal node;
the second control circuit comprises a third transistor serially coupled to a fourth transistor at the second signal node;

a gate of the first transistor of the first control circuit and a gate of the second transistor of the first control circuit are coupled to the data line; and a gate of the third transistor of the second control circuit and a gate of the fourth transistor of the second control circuit are coupled to the complement data line.

10. The TCC of claim 1, wherein:

the first control circuit further comprises:
- a first P-type transistor comprising:
  - a first source/drain region coupled to the first signal node of the first control circuit;
  - a gate coupled to a data line of the memory bit cell circuit; and
  - a second source/drain region coupled to the first input signal among the plurality of input signals indicating the ternary input value; and
- a first N-type transistor comprising:
  - a first source/drain region coupled to the first signal node of the first control circuit;
  - a gate coupled to the data line of the memory bit cell circuit; and
  - a second source/drain region coupled to the second input signal among the plurality of input signals indicating the ternary input value; and the second control circuit further comprises:
- a second P-type transistor comprising:
  - a first source/drain region coupled to the second signal node of the second control circuit;
  - a gate coupled to a complement data line of the memory bit cell circuit; and
  - a second source/drain region coupled to the third input signal among the plurality of input signals indicating the ternary input value; and
- a second N-type transistor comprising:
  - a first source/drain region coupled to the second signal node of the second control circuit;
  - a gate coupled to the complement data line of the memory bit cell circuit; and
  - a second source/drain region coupled to the fourth input signal among the plurality of input signals indicating the ternary input value.

11. The TCC of claim 1, wherein:

the first pass-gate transistor further comprises:
- a first source/drain region coupled to the first signal node; and
- a second source/drain region coupled to the ternary output; and the second pass-gate transistor further comprises:
- a first source/drain region coupled to the second signal node; and
- a second source/drain region coupled to the ternary output.

12. The TCC of claim 11, wherein:

the second source/drain region of the first pass-gate transistor is coupled to the second source/drain region of the second pass-gate transistor; and the ternary product signal comprises an analog signal.

13. The TCC of claim 11, wherein:

the second source/drain region of the first pass-gate transistor is coupled to a first read bit line;

the second source/drain region of the second pass-gate transistor is coupled to a second read bit line; and the ternary product signal is generated as a two-bit binary value on the first read bit line and the second read bit line.

14. The TCC of claim 1, wherein:

the ternary multiply circuit is further configured to multiply the ternary input value and the weight data by binary operations on a first binary input signal among the plurality of input signals, a second binary input signal among the plurality of input signals that is complementary to the first binary input signal, a third binary input signal among the plurality of input signals, and a fourth binary input signal among the plurality of input signals complementary to the third binary input signal, the first, second, third, and fourth binary input signals indicating the ternary input value, and at least one of a fifth binary input signal indicating the weight data and a sixth binary input signal indicating the complement weight data.

15. The TCC of claim 14, wherein:

the first control circuit is configured to generate the first product input signal based on the first binary input signal, the second binary input signal, and the weight data; and the second control circuit is configured to generate the second product input signal based on the third binary input signal, the fourth binary input signal, and the complement weight data.

16. The TCC of claim 14, wherein:

the first control circuit is configured to generate the first product input signal based on the first binary input signal, the third binary input signal, and the weight data; and the second control circuit is configured to generate the second product input signal based on the second binary input signal, the fourth binary input signal, and the complement weight data.

17. The TCC of claim 14, wherein:

the first control circuit is configured to generate the first product input signal based on the first binary input signal, the third binary input signal, and the weight data; and the second control circuit is configured to generate the second product input signal based on the second binary input signal, the fourth binary input signal, and the weight data.

18. The TCC of claim 14, wherein:

the first control circuit is configured to generate the first product input signal based on the second binary input signal, the fourth binary input signal, and the complement weight data; and the second control circuit is configured to generate the second product input signal based on the first binary input signal, the third binary input signal, and the complement weight data.

19. The TCC of claim 1, wherein the memory bit cell circuit comprises:

a first inverter comprising an output coupled to a first node and an input coupled to a second node;

a second inverter comprising an input coupled to the first node and an output coupled to the second node;

the first pass-gate transistor configured to couple a first bit line to the first node based on a word line voltage; and the second pass-gate transistor configured to couple a second bit line to the second node based on the word line voltage;

wherein the memory bit cell circuit is configured to store the weight data on the first node and store the complement weight data on the second node.

20. The TCC of claim 1 integrated in an integrated circuit (IC).

21. The TCC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

22. A method of multiplying a ternary input value with a stored weight data, comprising:
receiving a plurality of binary input signals indicating the ternary input value;
receiving the stored weight data from a memory bit cell circuit configured to store the weight data and a complement weight data complementary to the weight data;
receiving a read-enable signal on a read-enable input;
coupling at least one of a first binary input signal and a second binary input signal of the plurality of binary input signals to a first signal node to generate a first product input signal based on the stored weight data;
coupling at least one of a third binary input signal and a fourth binary input signal of the plurality of binary input signals to a second signal node to generate a second product input signal based on the stored weight data; and
generating a ternary product signal on a ternary output comprising:
coupling, by a first pass-gate transistor of a first type, the first signal node to the ternary output in response to receiving the read-enable signal comprising a first voltage on a gate of the first pass-gate transistor; and
coupling, by a second pass-gate transistor of the first type, the second signal node to the ternary output in response to receiving the read-enable signal comprising the first voltage on a gate of the second pass-gate transistor,
wherein the ternary product signal is based on the first product input signal and the second product input signal.

23. The method of claim 22, wherein:
receiving the read-enable signal comprises receiving, on the read-enable input, the first voltage that indicates the read-enable signal is in an active state; and
generating the ternary product signal on the ternary output further comprises coupling the first product input signal and the second product input signal to the ternary output in response to receiving the first voltage on the read-enable input indicating the read-enable signal is in the active state.

24. The method of claim 22, wherein:
coupling the at least one of the first binary input signal and the second binary input signal of the plurality of binary input signals to the first signal node further comprises coupling both of the first binary input signal and the second binary input signal to the first signal node; and
coupling the at least one of the third binary input signal and the fourth binary input signal of the plurality of binary input signals to the second signal node further comprises coupling both of the third binary input signal and the fourth binary input signal to the second signal node.

25. An in-memory ternary computation array, comprising:
an N×M array of ternary computation circuit (TCC) elements, wherein each of the TCC elements comprises:
a read-enable input configured to receive a read-enable signal;
a plurality of inputs configured to receive a plurality of input signals indicating a ternary input value;
a ternary output;
a memory bit cell circuit configured to store a weight data and a complement weight data complementary to the weight data; and
a ternary multiply circuit configured to multiply the ternary input value and the weight data in response to the read-enable signal indicating an active state, the ternary multiply circuit comprising:
a first control circuit configured to couple at least one of a first input signal and a second input signal among the plurality of input signals to a first signal node to generate a first product input signal based on the weight data;
a second control circuit configured to couple at least one of a third input signal and a fourth input signal among the plurality of input signals to a second signal node to generate a second product input signal based on the weight data; and
a product circuit configured to couple the first signal node to the ternary output in response to the read-enable signal and couple the second signal node to the ternary output in response to the read-enable signal to generate a ternary product signal on the ternary output based on the first product input signal and the second product input signal;
wherein the product circuit comprises:
a first pass-gate transistor of a first type coupled to the first signal node;
a second pass-gate transistor of the first type coupled to the second signal node; and
a gate of the first pass-gate transistor and a gate of the second pass-gate transistor coupled to each other and to the read-enable input.

26. The in-memory ternary computation array of claim 25, further comprising:
N pairs of row ternary input lines, each pair of row ternary input lines coupled to M TCC elements in a respective one of N rows of the N×M array; and
a row ternary input driver configured to provide N pairs of row ternary input signals on the N pairs of row ternary input lines.

27. The in-memory ternary computation array of claim 26, further comprising:
a weight write bit line driver configured to provide the weight data to bit lines and complement bit lines of M columns of the N×M array; and
a word line driver configured to control word lines to the N rows of the N×M array to store the weight data in the M TCC elements in the one of the N rows.

28. The in-memory ternary computation array of claim 26, further comprising:
M column read-enable lines, each column read-enable line coupled to the read-enable inputs of N TCC elements in a respective one of M columns of the N×M array;

M column ternary outputs each coupled to N ternary outputs in a respective one of the M columns of the N×M array, wherein the ternary output of each TCC element is an analog output and the ternary product signal of each TCC element is an analog signal; and a column controller configured to:
- drive a column read-enable line of the M column read-enable lines to set the read-enable signal in each of the N TCC elements in one of the M columns to indicate the active state;
- accumulate ternary product signals of the N TCC elements on one of the M column ternary outputs to generate an accumulated column output; and
- convert the accumulated column output to a digital value.

29. The in-memory ternary computation array of claim 26, further comprising:

N row read-enable lines, each row read-enable line coupled to the M TCC elements in a respective one of the N rows of the N×M array;

first and second column read bit lines in each of M columns, the first and second column read bit lines in each column coupled to the ternary outputs of N TCC elements in the column, wherein the ternary output of each TCC element comprises a first read bit line and a second read bit line and the ternary product signal of each TCC element is a two-bit binary signal;

a row controller configured to drive a row read-enable line of the N row read-enable lines to set the read-enable signal in each of the M TCC elements in one of the N rows to indicate the active state; and a column controller to generate M sums, one for each of the M columns, each sum generated by adding the ternary product signals on the first and second column read bit lines in response to the read-enable signals activated sequentially in respective rows of the N×M array.

* * * * *